United States Patent
McLaughlin et al.

(10) Patent No.: US 10,409,270 B2
(45) Date of Patent: Sep. 10, 2019

(54) METHODS FOR ON-PROCESS MIGRATION FROM ONE TYPE OF PROCESS CONTROL DEVICE TO DIFFERENT TYPE OF PROCESS CONTROL DEVICE

(71) Applicant: Honeywell International Inc., Morris Plains, NJ (US)

(72) Inventors: Paul F. McLaughlin, Ambler, PA (US); Cathleen F. Kilpatrick, Bethlehem, PA (US); Norman R. Swanson, Douglassville, PA (US); Joseph P. Felix, Jenkintown, PA (US)

(73) Assignee: Honeywell International Inc., Morris Plains, NJ (US)

( * ) Notice: Subject to any disclaimer, the term of this patent is extended or adjusted under 35 U.S.C. 154(b) by 495 days.

(21) Appl. No.: 15/078,832

(22) Filed: Mar. 23, 2016

(65) Prior Publication Data

US 2016/0299497 A1    Oct. 13, 2016

Related U.S. Application Data

(60) Provisional application No. 62/145,371, filed on Apr. 9, 2015.

(51) Int. Cl.
*G06F 17/00* (2019.01)
*G06F 11/20* (2006.01)
(Continued)

(52) U.S. Cl.
CPC ....... *G05B 19/4185* (2013.01); *G05B 19/042* (2013.01); *G05B 19/0421* (2013.01);
(Continued)

(58) Field of Classification Search
CPC ........ G06F 11/1658; G06F 8/34; G06F 17/50; G06F 11/2094; G05B 19/042; G05B 19/41855; G05B 19/0421
See application file for complete search history.

(56) References Cited

U.S. PATENT DOCUMENTS

| 4,679,189 A | 7/1987 | Olson et al. |
| 5,537,414 A | 7/1996 | Takiyasu et al. |

(Continued)

FOREIGN PATENT DOCUMENTS

| CN | 101819545 | 9/2010 |
| CN | 103605561 | 2/2014 |

(Continued)

OTHER PUBLICATIONS

Bernard Pagurek et al., Mobile Agents for Network Management, 1998 IEEE, [Retrieved on May 20, 2019]. Retrieved from the internet: <https://ieeexplore.ieee.org/stamp/stamp.jsp?arnumber=5340400> 8 Pages (1-8) (Year: 1998).*

(Continued)

*Primary Examiner* — Anibal Rivera

(57) ABSTRACT

A method includes installing new communication interfaces in first process controllers of an industrial process control and automation system. The first process controllers are configured to communicate over a first supervisory network, and the communication interfaces are configured to communicate over a second supervisory network of a different type. The method also includes migrating the first process controllers to second process controllers of a different type while maintaining control over an industrial process being controlled by the first process controllers. The second process controllers are configured to communicate over the second supervisory network.

21 Claims, 14 Drawing Sheets

(51) Int. Cl.
   *G05B 19/418* (2006.01)
   *G05B 19/042* (2006.01)
   *G06F 8/34* (2018.01)
   *G06F 17/50* (2006.01)

(52) U.S. Cl.
   CPC ............ *G05B 19/41855* (2013.01); *G05B 2219/25204* (2013.01); *G05B 2219/31115* (2013.01); *G05B 2219/32403* (2013.01); *G06F 8/34* (2013.01); *G06F 11/2094* (2013.01); *G06F 17/50* (2013.01)

(56) References Cited

U.S. PATENT DOCUMENTS

| | | |
|---|---|---|
| 5,566,356 A | 10/1996 | Taketsugu |
| 5,664,195 A | 9/1997 | Chatterji |
| 5,749,053 A | 5/1998 | Kusaki et al. |
| 5,898,826 A | 4/1999 | Pierce et al. |
| 6,141,769 A | 10/2000 | Petivan et al. |
| 6,192,232 B1 | 2/2001 | Iseyama |
| 6,256,297 B1 | 7/2001 | Haferbeck et al. |
| 6,292,905 B1 | 9/2001 | Wallach et al. |
| 6,374,352 B1 | 4/2002 | Goldman et al. |
| 6,427,071 B1 | 7/2002 | Adams et al. |
| 6,437,692 B1 | 8/2002 | Petite et al. |
| 6,631,416 B2 | 10/2003 | Bendinelli et al. |
| 6,694,447 B1 | 2/2004 | Leach et al. |
| 6,701,453 B2 | 3/2004 | Chrabaszcz |
| 6,751,219 B1 | 6/2004 | Lipp et al. |
| 6,847,316 B1 | 1/2005 | Keller |
| 6,850,486 B2 | 2/2005 | Saleh et al. |
| 6,917,584 B2 | 7/2005 | Kuwabara |
| 6,963,781 B2 | 11/2005 | Fehrer et al. |
| 7,031,308 B2 | 4/2006 | Garcia-Luna-Aceves et al. |
| 7,035,937 B2 | 4/2006 | Haas et al. |
| 7,058,848 B2 | 6/2006 | Sicola et al. |
| 7,190,961 B2 | 3/2007 | Burr |
| 7,203,743 B2 | 4/2007 | Shah-Heydari |
| 7,236,987 B1 | 6/2007 | Faulkner et al. |
| 7,240,188 B2 | 7/2007 | Takata et al. |
| 7,275,157 B2 | 9/2007 | Cam Winget |
| 7,366,114 B2 | 4/2008 | Park et al. |
| 7,440,735 B2 | 10/2008 | Karschnia et al. |
| 7,460,865 B2 | 12/2008 | Nixon et al. |
| 7,620,409 B2 | 11/2009 | Budampati et al. |
| 7,688,802 B2 | 3/2010 | Gonia et al. |
| 7,802,016 B2 | 9/2010 | Eimers-Klose et al. |
| 8,108,853 B2 | 1/2012 | Bale et al. |
| 8,498,201 B2 | 7/2013 | Budampati et al. |
| 8,756,412 B2 | 6/2014 | Pulini et al. |
| 9,261,868 B2 * | 2/2016 | Torigoe ............ G05B 19/0421 |
| 9,869,984 B2 * | 1/2018 | Tsuchiya ............ G05B 19/0421 |
| 2002/0072329 A1 | 6/2002 | Bandeira et al. |
| 2002/0120671 A1 | 8/2002 | Daffner et al. |
| 2002/0122230 A1 | 9/2002 | Izadpanah et al. |
| 2002/0176396 A1 | 11/2002 | Hammel et al. |
| 2003/0003912 A1 | 1/2003 | Melpignano et al. |
| 2003/0005149 A1 | 1/2003 | Haas et al. |
| 2003/0177150 A1 | 9/2003 | Fung et al. |
| 2003/0200323 A1 | 10/2003 | Dold |
| 2003/0212768 A1 | 11/2003 | Sullivan |
| 2004/0010694 A1 | 1/2004 | Collens et al. |
| 2004/0028023 A1 | 2/2004 | Mandhyan et al. |
| 2004/0029553 A1 | 2/2004 | Cain |
| 2004/0083833 A1 | 5/2004 | Hitt et al. |
| 2004/0174829 A1 | 9/2004 | Ayyagari |
| 2004/0230899 A1 | 11/2004 | Pagnano et al. |
| 2004/0254648 A1 * | 12/2004 | Johnson ............ G05B 19/042 700/1 |
| 2004/0259533 A1 * | 12/2004 | Nixon ............ H04W 76/14 455/414.1 |
| 2005/0059379 A1 | 3/2005 | Sovio et al. |
| 2005/0071708 A1 | 3/2005 | Bartfai et al. |
| 2005/0102562 A1 | 5/2005 | Shinohara et al. |
| 2005/0141553 A1 | 6/2005 | Kim et al. |
| 2005/0201349 A1 | 9/2005 | Budampati |
| 2005/0228509 A1 | 10/2005 | James |
| 2005/0254653 A1 | 11/2005 | Potashnik et al. |
| 2005/0281215 A1 | 12/2005 | Budampati et al. |
| 2005/0289553 A1 | 12/2005 | Miki |
| 2006/0002368 A1 | 1/2006 | Budampati et al. |
| 2006/0015641 A1 | 1/2006 | Ocko et al. |
| 2006/0039347 A1 | 2/2006 | Nakamura et al. |
| 2006/0083200 A1 | 4/2006 | Emeott et al. |
| 2006/0104301 A1 | 5/2006 | Beyer et al. |
| 2006/0128349 A1 | 6/2006 | Yoon |
| 2006/0171344 A1 | 8/2006 | Subramanian et al. |
| 2006/0171346 A1 | 8/2006 | Kolavennu et al. |
| 2006/0227729 A1 | 10/2006 | Budampati et al. |
| 2006/0256740 A1 | 11/2006 | Koski |
| 2006/0271814 A1 | 11/2006 | Fung et al. |
| 2006/0274644 A1 | 12/2006 | Budampati et al. |
| 2006/0274671 A1 | 12/2006 | Budampati et al. |
| 2006/0282498 A1 | 12/2006 | Muro |
| 2006/0287001 A1 | 12/2006 | Budampati et al. |
| 2007/0022317 A1 | 1/2007 | Chen et al. |
| 2007/0030816 A1 | 2/2007 | Kolavennu |
| 2007/0030832 A1 | 2/2007 | Gonia et al. |
| 2007/0067458 A1 | 3/2007 | Chand |
| 2007/0073861 A1 | 3/2007 | Amanuddin et al. |
| 2007/0076638 A1 | 4/2007 | Kore et al. |
| 2007/0077941 A1 | 4/2007 | Gonia et al. |
| 2007/0087763 A1 | 4/2007 | Budampati et al. |
| 2007/0089063 A1 * | 4/2007 | Breyer ............ G06F 8/34 715/763 |
| 2007/0091824 A1 | 4/2007 | Budampati et al. |
| 2007/0091825 A1 | 4/2007 | Budampati et al. |
| 2007/0103303 A1 | 5/2007 | Shoarinejad |
| 2007/0147294 A1 | 6/2007 | Bose et al. |
| 2007/0153677 A1 | 7/2007 | McLaughlin et al. |
| 2007/0153789 A1 | 7/2007 | Barker, Jr. et al. |
| 2007/0155423 A1 | 7/2007 | Carmody et al. |
| 2007/0237137 A1 | 10/2007 | McLaughlin |
| 2007/0261052 A1 | 11/2007 | Bale et al. |
| 2007/0280178 A1 | 12/2007 | Hodson et al. |
| 2008/0043637 A1 | 2/2008 | Rahman |
| 2008/0140844 A1 | 6/2008 | Halpern |
| 2008/0267259 A1 | 10/2008 | Budampati et al. |
| 2008/0273547 A1 * | 11/2008 | Phinney ............ H04L 1/1607 370/437 |
| 2008/0288120 A1 | 11/2008 | Lindenmuth |
| 2009/0022121 A1 * | 1/2009 | Budampati ............ H04L 1/1887 370/338 |
| 2009/0034441 A1 * | 2/2009 | Budampati ............ H04L 45/00 370/310 |
| 2009/0060192 A1 | 3/2009 | Budampati et al. |
| 2009/0086692 A1 | 4/2009 | Chen |
| 2009/0109889 A1 | 4/2009 | Budampati et al. |
| 2009/0125156 A1 * | 5/2009 | Killian ............ G06F 1/263 700/291 |
| 2009/0138541 A1 | 5/2009 | Wing et al. |
| 2010/0042869 A1 | 2/2010 | Szabo et al. |
| 2010/0128699 A1 | 5/2010 | Yang et al. |
| 2010/0287548 A1 | 11/2010 | Zhou et al. |
| 2010/0291897 A1 * | 11/2010 | Ghai ............ H04L 63/0272 455/410 |
| 2011/0305206 A1 | 12/2011 | Junell et al. |
| 2012/0017031 A1 | 1/2012 | Mashtizadeh et al. |
| 2012/0101663 A1 | 4/2012 | Fervel et al. |
| 2012/0117416 A1 * | 5/2012 | McLaughlin ....... G06F 11/1658 714/4.11 |
| 2013/0219161 A1 | 8/2013 | Fontignie et al. |
| 2013/0253671 A1 * | 9/2013 | Torigoe ............ G05B 19/0421 700/82 |
| 2015/0205280 A1 * | 7/2015 | Tsuchiya ............ G05B 19/0421 700/20 |
| 2016/0062350 A1 * | 3/2016 | Prall ............ G05B 19/41855 700/20 |

(56) References Cited

U.S. PATENT DOCUMENTS

| | | | |
|---|---|---|---|
| 2016/0174406 A1* | 6/2016 | Dobler | H05K 7/1461 361/752 |
| 2017/0242771 A1* | 8/2017 | Khemani et al. | G06F 11/2094 |

FOREIGN PATENT DOCUMENTS

| | | |
|---|---|---|
| DE | 4134207 C1 | 4/1993 |
| DE | 103 14 721 A1 | 11/2004 |
| EP | 1 081 895 A1 | 3/2001 |
| EP | 1 401 171 A2 | 3/2004 |
| EP | 1 439 667 A2 | 7/2004 |
| GB | 2 427 329 A | 12/2006 |
| WO | WO 01/35190 A2 | 5/2001 |
| WO | WO 03/079616 A1 | 9/2003 |
| WO | WO 2004/047385 A2 | 6/2004 |
| WO | WO 2004/114621 A1 | 12/2004 |
| WO | WO 2006/017994 A1 | 2/2006 |
| WO | WO 2006/053041 A1 | 5/2006 |

OTHER PUBLICATIONS

D.M. Desai et al., BladeCenter system overview, 2005, [Retrieved on May 20, 2019]. Retrieved from the internet: <https://pdfs.semanticscholar.org/1ae5/133f566a7280f45585e162fda38dadf1910e.pdf> 13 Pages (809-821) (Year: 2005).*

Jerker Delsing et al., Migration of Industrial Process Control Systems into Service, 2012, [Retrieved on Nov. 22, 2016]. Retrieved from the internet: <URL: https://www.diva-portal.org/smash/get/diva2:1000535/FULLTEXT01.pdf> 7 Pages (5790-5796) (Year: 2012).*

Salman Taherian, et al., "Event Dissemination in Mobile Wireless Sensor Networks", 2004 IEEE International Conference on Mobile Ad-Hoc and Sensor Systems, p. 573-575.

Dongyan Chen et al., "Dependability Enhancement for IEEE 802.11 Wireless LAN with Redundancy Techniques," Proceedings of the 2003 International Conference on Dependable Systems and Networks, 2003, 8 pages.

Dr. Soumitri Kolavennu, Presentation, "WNSIA MAC Layer", ISA SP100 meeting, Feb. 14, 2007, 24 pages, see esp. p. 17.

Ying Zhang, et al., "A Learning-based Adaptive Routing Tree for Wireless Sensor Networks", Journal of Communications, vol. 1, No. 2, May 2006, p. 12-21.

Yau-Ming Sun, et al., "An Efficient Deadlock-Free Tree-Based Routing Algorithm for Irregular Wormhole-Routed Networks Based on the Turn Model", Proceedings of the 2004 International Conference on Parallel Processing (ICPP'04), 10 pages.

Sejun Song, "Fault Recovery Port-based Fast Spanning Tree Algorithm (FRP-FAST) for the Fault-Tolerant Ethernet on the Arbitrary Switched Network Topology", 2001 IEEE, p. 325-332.

"XYR 5000 Wireless Transmitters, Honeywell Solutions for Wireless Data Acquisiton and Monitoring," www.acs.honeywell.com, Feb. 2006, 6 pages.

Communication pursuant to Article 94(3) EPC dated Apr. 2, 2009 in connection with European Patent Application No. 07 761 784.3, 9 pgs.

A. Aiello et al., "Wireless Distributed Measurement System by Using Mobile Devices," IEEE Workshop on Intelligent Data Acquisition and Advanced Computing Systems: Technology and Applications, Sep. 5-7, 2005, Sofia, Bulgaria, pp. 316-319.

International Search Report and Written Opinion of the International Searching Authority in PCT Application No. PCT/US2007/069717 dated Dec. 10, 2007, 10 pgs.

International Search Report and Written Opinion of the International Searching Authority in PCT Application No. PCT/US2007/069614 dated Nov. 22, 2007, 9 pgs.

International Search Report and Written Opinion of the International Searching Authority in PCT Application No. PCT/US2007/069710 dated Nov. 27, 2007, 10 pgs.

International Search Report and Written Opinion of the International Searching Authority in PCT Application No. PCT/US2007/069705 dated Apr. 15, 2008, 9 pgs.

Pereira, J.M. Dias, "A Fieldbus Prototype for Educational Purposes", IEEE Instrumentation & Measurement Magazine, New York, NY vol. 7, No. 1, Mar. 2004, p. 24-31.

International Search Report and Written Opinion of the International Searching Authority in PCT Application No. PCT/US2006/048334 dated Jul. 5, 2007, 10 pgs.

European Search Report dated Oct. 6, 2008 in connection with European Patent Application No. 08 16 1387.9, 3 pgs.

Strilich, et al.; "Gateway Offering Logical Model Mapped to Independent Underlying Networks"; U.S. Appl. No. 14/269,903, filed May 5, 2014; 49 pages.

David E. Lowell, et al., "Devirtualizable Virtual Machines Enabling General, Single-Node, Online Maintenance", ASPLOS'04, Oct. 9-13, 2004, p. 211-223.

Olivier Crameri, et al., "Staged Deployment in Mirage, an Integrated Software Upgrade Testing and Distribution System", SOSP'07, Oct. 14-17, 2007, 16 pages.

Ramakrishna S. Budampati, et al., "Apparatus and Method for Improving the Reliability of Industrial Wireless Networks That Experience Outages in Backbone Connectivity", U.S. Appl. No. 12/869,557, filed Aug. 26, 2010, 27 pgs.

Christopher Pulini, et al. "Gateway Supporting Transparent Redundancy in Process Control Systems and Other Systems and Related Method", U.S. Appl. No. 12/762,215, filed Apr. 16, 2010, 56 pgs.

Paul F. McLaughlin et al., "On-Process Migration From One Type of "Level 1" Process Controller to a Different Type of "Level 1" Process Controller", U.S. Appl. No. 62/145,371, filed Apr. 9, 2015, 22 pgs.

John M. Prall et al., "Apparatus and Method for On-Process Migration of Industrial Control and Automation System Across Disparate Network Types", U.S. Appl. No. 14/476,355, filed Sep. 3, 2014, 39 pgs.

Prakash Mani et al., "Method and Apparatus for an On-Process Migration in a Virtual Environment Within an Industrial Process Control and Automation System", U.S. Appl. No. 14/871,898, filed Sep. 30, 2015, 45 pgs.

Paul F. McLaughlin, "Method and System for Process Control Network Migration", U.S. Appl. No. 12/942,177, filed Nov. 9, 2010, 39 pgs.

Sreenivasamurthy et al., "Method and System for Distributed Control System (DCS) Process Data Cloning and Migration Through Secured File System", U.S. Appl. No. 14/681,536, filed Apr. 8, 2015, 31 pgs.

Emerson, "PLC to DeltaV Systems Migration PLC to DeltaV(TM) Systems Migration This document describes PLC to DeltaV(TM) system integration and methods for migrating PLC functions to a DeltaV system. PLC to DeltaV Systems Migration.", Mar. 12, 2012.

* cited by examiner

METHODS FOR ON-PROCESS MIGRATION FROM ONE TYPE OF PROCESS CONTROL DEVICE TO DIFFERENT TYPE OF PROCESS CONTROL DEVICE

CROSS-REFERENCE TO RELATED APPLICATION AND PRIORITY CLAIM

This application claims priority under 35 U.S.C. § 119(e) to U.S. Provisional Patent Application No. 62/145,371 filed on Apr. 9, 2015, which is hereby incorporated by reference in its entirety.

TECHNICAL FIELD

This disclosure relates generally to industrial process control and automation systems. More specifically, this disclosure relates to methods for on-process migration from one type of process control device to a different type of process control device.

BACKGROUND

Industrial process control and automation systems are often used to automate large and complex industrial processes. These types of systems routinely include sensors, actuators, controllers, and servers. The controllers typically receive measurements from the sensors and generate control signals for the actuators. The servers typically oversee the operation of lower-level devices, including the controllers.

It may become necessary or desirable to upgrade an existing device in a control and automation system. This upgrade could take different forms, such as the installation of new software on an existing device or the replacement of existing device hardware with new device hardware. Upgrades may be needed or desired for various reasons, such as obsolescence of an existing device, feature or function improvements available in a new device, or greater capacity available in a new device.

Ideally, a device could be upgraded while an industrial process remains online, meaning the industrial process continues to operate during the upgrade. This can help to avoid a manufacturing shutdown and allow continued management of critical support infrastructures. Unfortunately, it has been difficult to provide this type of on-process upgrade when a new device is a different type from its predecessor, such as when the new device has a different software basis, physical form-factor, cabinet layout, power subsystem, or physical supervisory network medium.

SUMMARY

This disclosure relates to methods for on-process migration from one type of process control device to a different type of process control device.

In a first embodiment, a method includes installing new communication interfaces in first process controllers of an industrial process control and automation system. The first process controllers are configured to communicate over a first supervisory network, and the communication interfaces are configured to communicate over a second supervisory network of a different type. The method also includes migrating the first process controllers to second process controllers of a different type while maintaining control over an industrial process being controlled by the first process controllers. The second process controllers are configured to communicate over the second supervisory network.

In a second embodiment, a method includes installing new communication interfaces in process controllers of an industrial process control and automation system. The process controllers are configured to communicate over a first supervisory network, and the communication interfaces are configured to communicate over a second supervisory network of a different type. The method also includes migrating first supervisory servers to second supervisory servers while maintaining control over an industrial process being controlled by the process controllers. The first supervisory servers are configured to communicate over the first supervisory network, and the second supervisory servers are configured to communicate over the second supervisory network.

In a third embodiment, a method includes controlling an industrial process using first process controllers of an industrial process control and automation system. The method also includes installing a direct-connected operator station configured to communicate with the first process controllers. The method further includes replacing a secondary one of the first process controllers with a primary one of multiple second process controllers. The method also includes operating the primary one of the second process controllers using at least a primary server while operating a primary one of the first process controllers using the direct-connected operator station. In addition, the method includes replacing the primary one of the first process controllers with a secondary one of the second process controllers. The first process controllers are replaced with the second process controllers while maintaining control over the industrial process.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 11, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
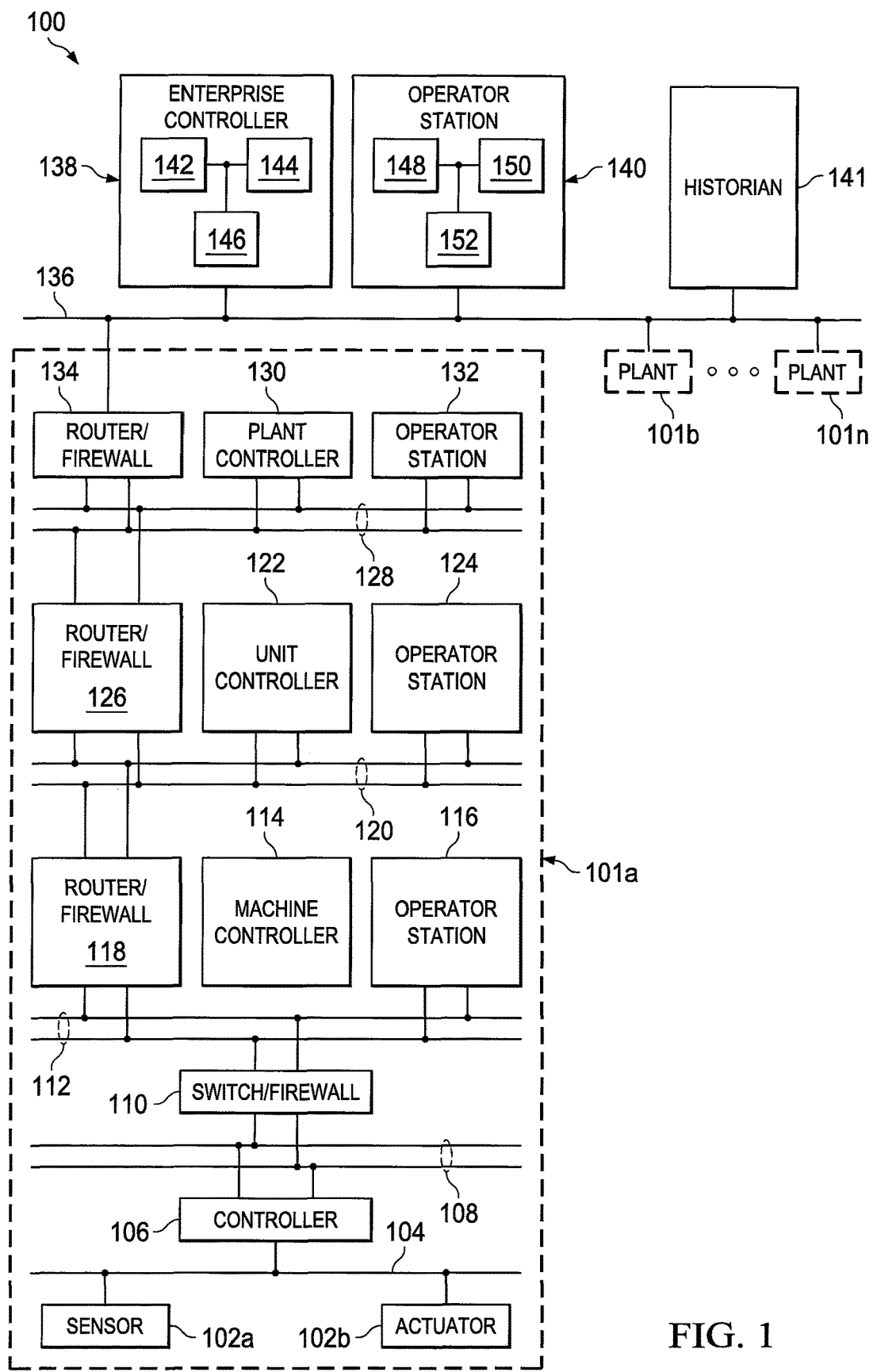
FIG. 1 illustrates an example industrial process control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 is used here to facilitate control over components in one or multiple plants 101a-101n. Each plant 101a-101n represents one or more processing facilities (or one or more portions thereof), such as one or more manufacturing facilities for producing at least one product or other material. In general, each plant 101a-101n may implement one or more processes and can individually or collectively be referred to as a process system. A process system generally represents any system or portion thereof configured to process one or more products or other materials in some manner.

In FIG. 1, the system 100 is implemented using the Purdue model of process control. In the Purdue model, "Level 0" may include one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, or flow rate. Also, the actuators 102b could alter a wide variety of characteristics in the process system. The sensors 102a and actuators 102b could represent any other or additional components in any suitable process system. Each of the sensors 102a includes any suitable structure for measuring one or more characteristics in a process system. Each of the actuators 102b includes any suitable structure for operating on or affecting one or more conditions in a process system.

At least one network 104 is coupled to the sensors 102a and actuators 102b. The network 104 facilitates interaction with the sensors 102a and actuators 102b. For example, the network 104 could transport measurement data from the sensors 102a and provide control signals to the actuators 102b. The network 104 could represent any suitable network or combination of networks. As particular examples, the network 104 could represent an Ethernet network, an electrical signal network (such as a HART or FOUNDATION FIELDBUS network), a pneumatic control signal network, or any other or additional type(s) of network(s).

In the Purdue model, "Level 1" may include one or more controllers 106, which are coupled to the network 104. Among other things, each controller 106 may use the measurements from one or more sensors 102a to control the operation of one or more actuators 102b. For example, a controller 106 could receive measurement data from one or more sensors 102a and use the measurement data to generate control signals for one or more actuators 102b. Multiple controllers 106 could also operate in a redundant configuration, such as when one controller 106 operates as a primary controller while another controller 106 operates as a backup controller (which synchronizes with the primary controller and can take over for the primary controller in the event of a fault with the primary controller). Each controller 106 includes any suitable structure for interacting with one or more sensors 102a and controlling one or more actuators 102b. Each controller 106 could, for example, represent a proportional-integral-derivative (PID) controller or a multivariable controller, such as a Robust Multivariable Predictive Control Technology (RMPCT) controller or other type of controller implementing model predictive control (MPC) or other advanced predictive control (APC). As a particular example, each controller 106 could represent a computing device running a real-time operating system.

One or more networks 108 are coupled to the controllers 106. The networks 108 facilitate interaction with the controllers 106, such as by transporting data to and from the controllers 106. The networks 108 could represent any suitable networks or combination of networks. As a particular example, the networks 108 could represent an Ethernet network or a redundant pair of Ethernet networks, such as a FAULT TOLERANT ETHERNET (FTE) network from HONEYWELL INTERNATIONAL INC.

At least one switch/firewall 110 couples the networks 108 to two networks 112. The switch/firewall 110 may transport traffic from one network to another. The switch/firewall 110 may also block traffic on one network from reaching another network. The switch/firewall 110 includes any suitable structure for providing communication between networks, such as a HONEYWELL CONTROL FIREWALL (CF9) device. The networks 112 could represent any suitable networks, such as an FTE network.

In the Purdue model, "Level 2" may include one or more machine-level controllers 114 coupled to the networks 112. The machine-level controllers 114 perform various functions to support the operation and control of the controllers 106, sensors 102a, and actuators 102b, which could be associated with a particular piece of industrial equipment (such as a boiler or other machine). For example, the machine-level controllers 114 could log information collected or generated by the controllers 106, such as measurement data from the sensors 102a or control signals for the actuators 102b. The machine-level controllers 114 could also execute applications that control the operation of the controllers 106, thereby controlling the operation of the actuators 102b. In addition, the machine-level controllers 114 could provide secure access to the controllers 106. Each of the machine-level controllers 114 includes any suitable structure for providing access to, control of, or operations related to a machine or other individual piece of equipment. Each of the machine-level controllers 114 could, for example, represent a server computing device running a MICROSOFT WINDOWS operating system. Although not shown, different machine-level controllers 114 could be used to control different pieces of equipment in a process system (where each piece of equipment is associated with one or more controllers 106, sensors 102a, and actuators 102b).

One or more operator stations 116 are coupled to the networks 112. The operator stations 116 represent computing or communication devices providing user access to the machine-level controllers 114, which could then provide user access to the controllers 106 (and possibly the sensors 102a and actuators 102b). As particular examples, the operator stations 116 could allow users to review the operational history of the sensors 102a and actuators 102b using information collected by the controllers 106 and/or the machine-level controllers 114. The operator stations 116 could also allow the users to adjust the operation of the sensors 102a, actuators 102b, controllers 106, or machine-level controllers 114. In addition, the operator stations 116 could receive and display warnings, alerts, or other messages or displays generated by the controllers 106 or the machine-level controllers 114. Each of the operator stations 116 includes any suitable structure for supporting user access and control of one or more components in the system 100. Each of the operator stations 116 could, for example, represent a computing device running a MICROSOFT WINDOWS operating system.

At least one router/firewall 118 couples the networks 112 to two networks 120. The router/firewall 118 includes any suitable structure for providing communication between networks, such as a secure router or combination router/firewall. The networks 120 could represent any suitable networks, such as an FTE network.

In the Purdue model, "Level 3" may include one or more unit-level controllers 122 coupled to the networks 120. Each unit-level controller 122 is typically associated with a unit in a process system, which represents a collection of different machines operating together to implement at least part of a process. The unit-level controllers 122 perform various functions to support the operation and control of components in the lower levels. For example, the unit-level controllers 122 could log information collected or generated by the components in the lower levels, execute applications that control the components in the lower levels, and provide secure access to the components in the lower levels. Each of the unit-level controllers 122 includes any suitable structure for providing access to, control of, or operations related to one or more machines or other pieces of equipment in a process unit. Each of the unit-level controllers 122 could, for example, represent a server computing device running a MICROSOFT WINDOWS operating system. Although not shown, different unit-level controllers 122 could be used to control different units in a process system (where each unit is associated with one or more machine-level controllers 114, controllers 106, sensors 102*a*, and actuators 102*b*).

Access to the unit-level controllers 122 may be provided by one or more operator stations 124. Each of the operator stations 124 includes any suitable structure for supporting user access and control of one or more components in the system 100. Each of the operator stations 124 could, for example, represent a computing device running a MICROSOFT WINDOWS operating system.

At least one router/firewall 126 couples the networks 120 to two networks 128. The router/firewall 126 includes any suitable structure for providing communication between networks, such as a secure router or combination router/firewall. The networks 128 could represent any suitable networks, such as an FTE network.

In the Purdue model, "Level 4" may include one or more plant-level controllers 130 coupled to the networks 128. Each plant-level controller 130 is typically associated with one of the plants 101*a*-101*n*, which may include one or more process units that implement the same, similar, or different processes. The plant-level controllers 130 perform various functions to support the operation and control of components in the lower levels. As particular examples, the plant-level controller 130 could execute one or more manufacturing execution system (MES) applications, scheduling applications, or other or additional plant or process control applications. Each of the plant-level controllers 130 includes any suitable structure for providing access to, control of, or operations related to one or more process units in a process plant. Each of the plant-level controllers 130 could, for example, represent a server computing device running a MICROSOFT WINDOWS operating system.

Access to the plant-level controllers 130 may be provided by one or more operator stations 132. Each of the operator stations 132 includes any suitable structure for supporting user access and control of one or more components in the system 100. Each of the operator stations 132 could, for example, represent a computing device running a MICROSOFT WINDOWS operating system.

At least one router/firewall 134 couples the networks 128 to one or more networks 136. The router/firewall 134 includes any suitable structure for providing communication between networks, such as a secure router or combination router/firewall. The network 136 could represent any suitable network, such as an enterprise-wide Ethernet or other network or all or a portion of a larger network (such as the Internet).

In the Purdue model, "Level 5" may include one or more enterprise-level controllers 138 coupled to the network 136. Each enterprise-level controller 138 is typically able to perform planning operations for multiple plants 101*a*-101*n* and to control various aspects of the plants 101*a*-101*n*. The enterprise-level controllers 138 can also perform various functions to support the operation and control of components in the plants 101*a*-101*n*. As particular examples, the enterprise-level controller 138 could execute one or more order processing applications, enterprise resource planning (ERP) applications, advanced planning and scheduling (APS) applications, or any other or additional enterprise control applications. Each of the enterprise-level controllers 138 includes any suitable structure for providing access to, control of, or operations related to the control of one or more plants. Each of the enterprise-level controllers 138 could, for example, represent a server computing device running a MICROSOFT WINDOWS operating system. In this document, the term "enterprise" refers to an organization having one or more plants or other processing facilities to be managed. Note that if a single plant 101*a* is to be managed, the functionality of the enterprise-level controller 138 could be incorporated into the plant-level controller 130.

Access to the enterprise-level controllers 138 may be provided by one or more operator stations 140. Each of the operator stations 140 includes any suitable structure for supporting user access and control of one or more components in the system 100. Each of the operator stations 140 could, for example, represent a computing device running a MICROSOFT WINDOWS operating system.

Various levels of the Purdue model can include other components, such as one or more databases. The database(s) associated with each level could store any suitable information associated with that level or one or more other levels of the system 100. For example, a historian 141 can be coupled to the network 136. The historian 141 could represent a component that stores various information about the system 100. The historian 141 could, for instance, store information used during production scheduling and optimization. The historian 141 represents any suitable structure for storing and facilitating retrieval of information. Although shown as a single centralized component coupled to the network 136, the historian 141 could be located elsewhere in the system 100, or multiple historians could be distributed in different locations in the system 100.

In particular embodiments, the various controllers and operator stations in FIG. 1 may represent computing devices. For example, each of the controllers 106, 114, 122, 130, 138 could include one or more processing devices 142 and one or more memories 144 for storing instructions and data used, generated, or collected by the processing device(s) 142. Each of the controllers 106, 114, 122, 130, 138 could also include at least one network interface 146, such as one or more Ethernet interfaces or wireless transceivers. Also, each of the operator stations 116, 124, 132, 140 could include one or more processing devices 148 and one or more memories 150 for storing instructions and data used, generated, or collected by the processing device(s) 148. Each of the operator stations 116, 124, 132, 140 could also include at least one network interface 152, such as one or more Ethernet interfaces or wireless transceivers.

As noted above, it may become necessary or desirable to upgrade one or more existing controllers 106 or other devices in the system 100, such as by installing new software on an existing device or by replacing existing hardware of a device with new hardware. However, it has been difficult to provide an on-process upgrade when a new device is a different type from its predecessor, such as when the new device has a different software basis, physical form-factor, cabinet layout, power subsystem, physical supervisory network medium, or processor or memory hardware.

This disclosure describes techniques to solve these and other problems by providing an on-process upgrade capability for unlike devices. Among other things, this approach supports the following features or any combination thereof. A path to an input/output (I/O) subsystem can be maintained during a migration, and the approach can ensure that I/O values hold their last values on a migration transition. The approach can also ensure that control blocks are initialized and their operation is maintained across the upgrade. Disruption of peer-to-peer (P2P) communications with other "Level 1" devices and "Level 2" supervisory device controllers can be reduced or minimized across the upgrade, and the approach can maintain operator views and alarms/events when upgrading. Disruption to history (logging) when upgrading can be reduced or minimized, and this approach can provide a physical migration kit that allows a secondary device to be updated to a new hardware form factor. Finally, this approach can allow for unlike supervisory network updates.

Additional details regarding specific implementations of this migration technique are provided below. Note that in particular embodiments described in this patent document, an example upgrade from a HONEYWELL EXPERIONPKS C200 controller to a HONEYWELL EXPERIONPKS C300 controller is described. The C200 controller is a classic rack-based control device with network cards that allow for uplink (DCS) access and downlink (I/O) access. The C300 is a chassis-less design that supports Ethernet for the DCS connection and on-board I/O link communications to PM and Series-C style I/O. A technique for providing on-process migration from a C200 controller to a C300 controller can leverage the capability to do database image synchronization and dynamic state data transfers from the C200 controller to the C300 controller. One specific example technique is to first move a ControlNet-based C200 controller to simultaneously support Ethernet so that it can have a common path to the C300 controller for this database transfer as well as to support peer-peer communications. The C300 controller is also built with support for both C200 Series-A style I/O and PM IOL-based I/O. The EXPERION system is enhanced to allow plant personnel to coordinate and command the upgrade from all C200 controllers to C300 controllers and to support, if necessary, the change from ControlNet to Ethernet. This, however, is an example only and merely meant to illustrate one possible upgrade between devices with different form factors and different network connectivities. Different permutations can also apply, such as for devices having the same form factor with different network connectivities, different form factors with the same network connectivity, or even the same factor with the same network connectivity.

Although FIG. 1 illustrates one example of an industrial process control and automation system 100, various changes may be made to FIG. 1. For example, a control and automation system could include any number of sensors, actuators, controllers, servers, operator stations, networks, and other components. Also, the makeup and arrangement of the system 100 in FIG. 1 is for illustration only. Components could be added, omitted, combined, or placed in any other suitable configuration according to particular needs. Further, particular functions have been described as being performed by particular components of the system 100. This is for illustration only. In general, control and automation systems are highly configurable and can be configured in any suitable manner according to particular needs. In addition, FIG. 1 illustrates an example environment in which on-process migration of "Level 1" process controllers can be used. This functionality can be used in any other suitable system.

FIGS. 2A through 2E illustrate an example technique and related methods for migration of devices in an industrial process control and automation system according to this disclosure. For ease of explanation, the technique and methods shown in FIGS. 2A through 2E may be described with respect to the system 100 of FIG. 1. However, the technique and methods could be used in any other suitable system.

In this example, a pair of redundant process controllers 205a-205b (referred to as "old" controllers) is being migrated to a pair of redundant process controllers 210a-210b of a different type (referred to as "new" controllers). Each process controller 205a-205b can have the ability to hold its I/O outputs through short disconnects between the Level 1 process controllers and their I/O. Also, each process controller 210a-210b can have the ability to take or resume control from an unlike partner with configuration and run-time data from the unlike partner. Optionally, a pair of redundant servers 215a-215b (referred to as "old" servers) may also or alternatively be migrated to a pair of redundant servers 220a-220b (referred to as "new" servers), although the servers need not be upgraded while the process controllers are being upgraded. The controllers 205a-205b, 210a-210b here could denote multiple controllers 106, and the servers here could denote higher-level components. The servers could be physical servers or virtual servers operating in one or more virtual environments. Also shown is a supervisory network 230 (referred to as an "old" network) being upgraded to a supervisory network 235 (referred to as a "new" network), which could denote different versions of the network 108. In addition, at least one operator station 225 is provided that can connect directly to "Level 1" process controllers 205a-205b, 210a-210b and that can provide process views independent of server nodes.

Figure 2A:
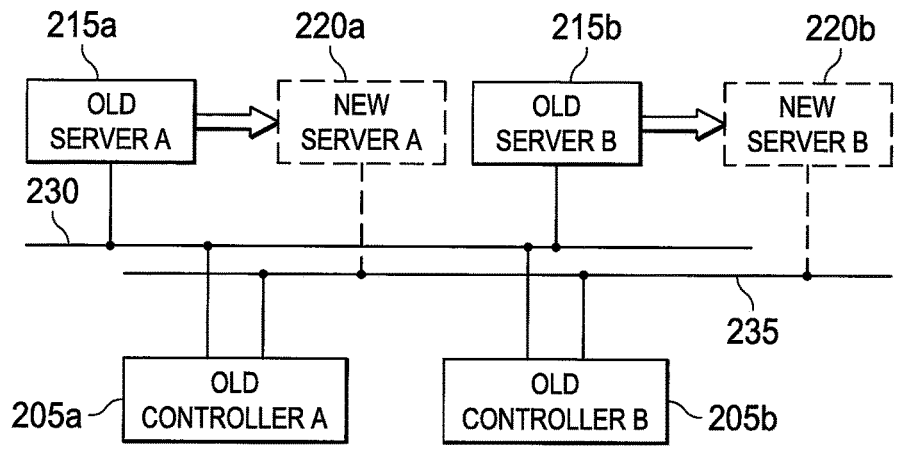
FIGS. 2A through 2E illustrate an example technique and related methods for migration of devices in an industrial process control and automation system according to this disclosure.

Referring to FIG. 2A, each of the old controllers 205a-205b can originally be configured to communicate over only the old network 230. The old controllers 205a-205b can also be configured to communicate with one another via the old network 230 so that the controllers 205a-205b can function as a redundant pair. In addition, each of the old servers 215a-215b may originally be configured to communicate with the old controllers 205a-205b via the old network 230.

As part of the migration process, each of the old controllers 205a-205b can be configured to communicate over the new network 235 in addition to the old network 230. For example, a communication module can be installed in each of the old controllers 205a-205b to allow each controller 205a-205b to communicate over the new network 235. The addition of the communication modules to the old controllers 205a-205b can be done on-process, meaning the controllers 205a-205b can continue to operate and control one or more industrial processes while the addition of the new communication modules occurs. In this way, a supervisory network between the "Level 2" redundant servers and the "Level 1" process controllers can be upgraded while staying on-process and maintaining view. Once the controllers 205a-205b are able to communicate over both networks 230-235, the old redundant servers 215a-215b on the old network 230 can be migrated to the new redundant servers 220a-220b on the new network 235 (if desired) as shown in FIG. 2A.

Figure 2B:
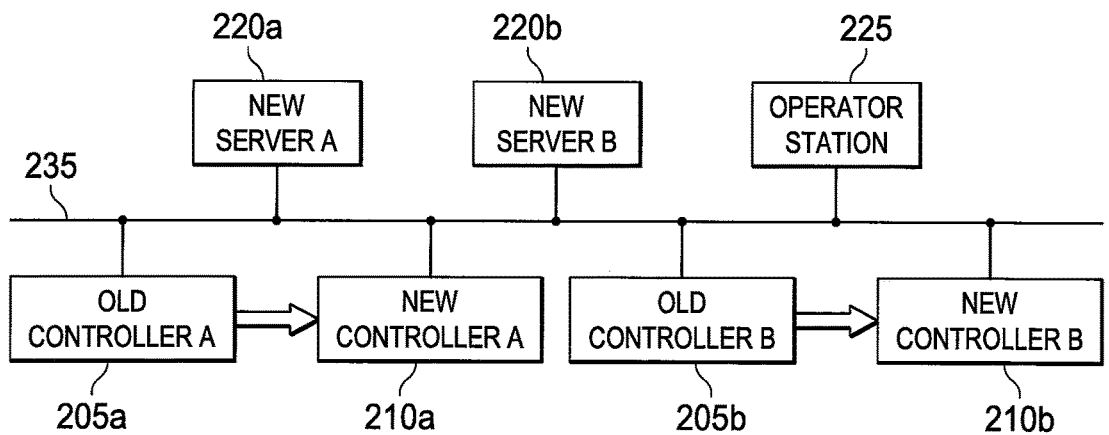

Referring to FIG. 2B, the old redundant controllers 205a-205b are migrated to the new redundant controllers 210a-210b during on-process migration. The redundant controllers 210a-210b denote unlike devices compared to the redundant controllers 205a-205b. Because the old controllers 205a-205b can communicate over both the old network 230 and the new network 235, supervision over the controllers 205a-205b, 210a-210b can be maintained using at least one of the servers 215a-215b, 220a-220b throughout the entire migration process. In this way, the "Level 1" process controllers are upgraded while staying on-process and maintaining view.

Figure 2C:
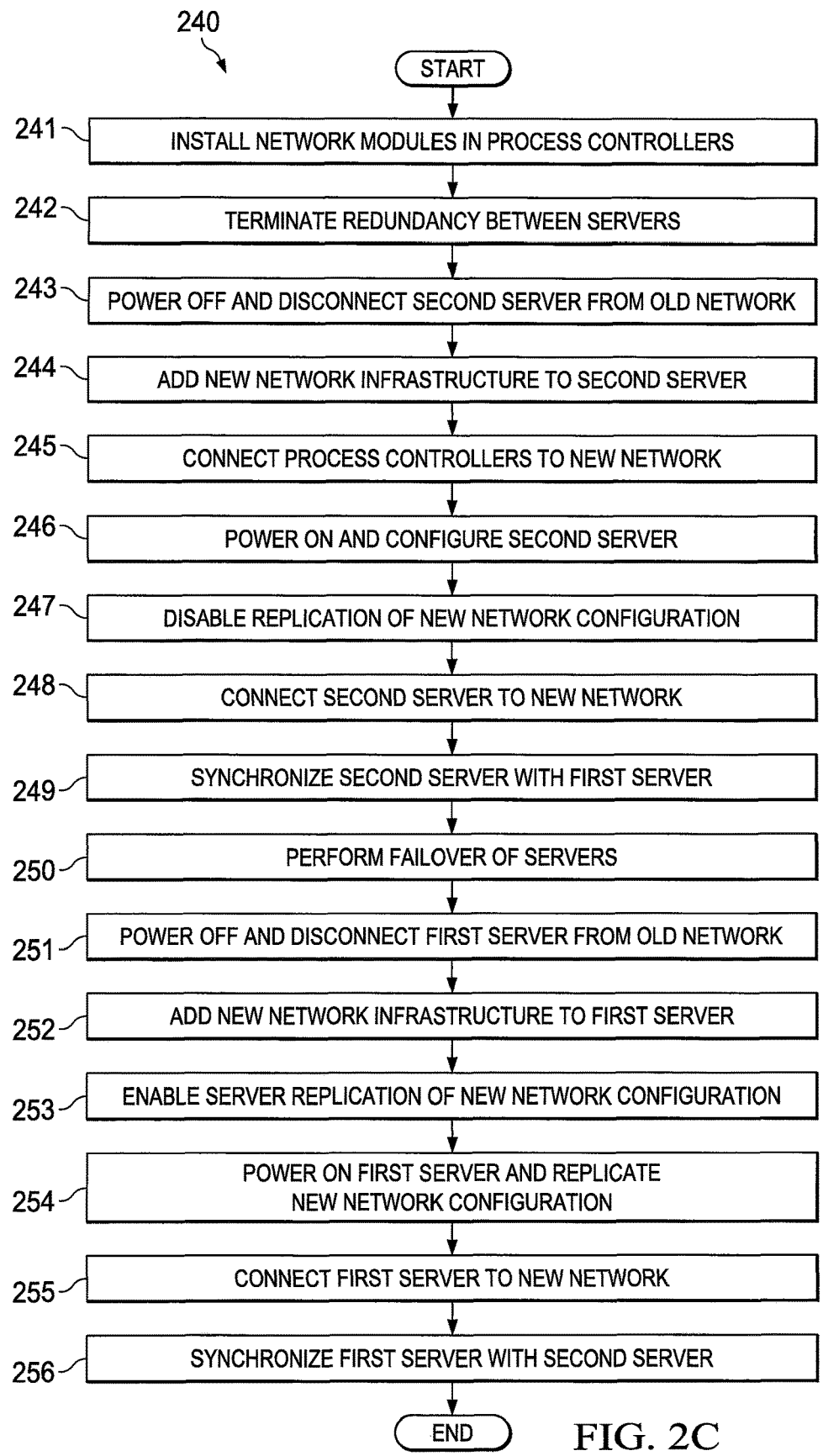

In some embodiments, the portion of the migration process shown in FIG. 2A can be accomplished using a method 240 as shown in FIG. 2C. Note that FIG. 2C assumes the supervisory network 230 is being replaced with the supervisory network 235 but the servers 215a-215b are not being replaced (merely upgraded to communicate over the supervisory network 235).

As shown in FIG. 2C, new network-capable modules are inserted into the "Level 1" process controllers 205a-205b (while the controllers 205a-205b are running) at step 241. These modules are used to communicate over the supervisory network 235 that has been, is being, or will be installed. Redundancy between the servers 215a-215b is terminated so the system is operated on a single server 215a at step 242. This could denote a standard function in systems that use redundant servers. The second server 215b is powered off and its network connections are disconnected from the old network 230 at step 243. Infrastructure for the new network 235 (such as a suitable network interface card, cabling, and switches) is added to the server 215b at step 244. The "Level 1" process controllers 205a-205b are connected to the new network 235 at step 245, such as via the new modules in the process controllers 205a-205b.

The second server 215b is powered back on, the new network type for the new network 235 is enabled on the server 215b, and the server 215b is configured to communicate with the "Level 1" process controllers 205a-205b over the new network 235 at step 246. Replication of the new supervisory network configuration from the server 215b to the server 215a is disabled at step 247. The second server 215b is connected to the new network 235 at step 248. The server 215b is synchronized with run-time or other data of the server 215a (excluding network configuration data) at step 249. A failover occurs from the server 215a to the server 215b at step 250, which allows the server 215b to become the primary server and communicate over the new network 235 with the "Level 1" process controllers 205a-205b. The server 215b can then maintain view and control over the process controllers 205a-205b.

The server 215a is powered off and its network connections are disconnected from the old network 230 at step 251. Infrastructure for the new network 235 (such as a suitable network interface card, cabling, and switches) is added to the server 215a at step 252. Replication of the new supervisory network configuration from the server 215b to the server 215a is enabled at step 253. The server 215a is powered on, the new network type for the new network 235 is enabled on the server 215a, and the configuration performed on the server 215b to communicate with the "Level 1" process controllers 205a-205b over the new network 235 is replicated to the server 215a at step 254. The server 215a is connected to the new network 235 at step 255, which allows the server 215a to become the new secondary server. The server 215a is synchronized with the server 215b at step 256. At this point, both servers 215a-215b are able to communicate with the process controllers 205a-205b via the new network 235, and (if needed) the server 215a is ready to take over and act as the primary server.

Figure 2D:
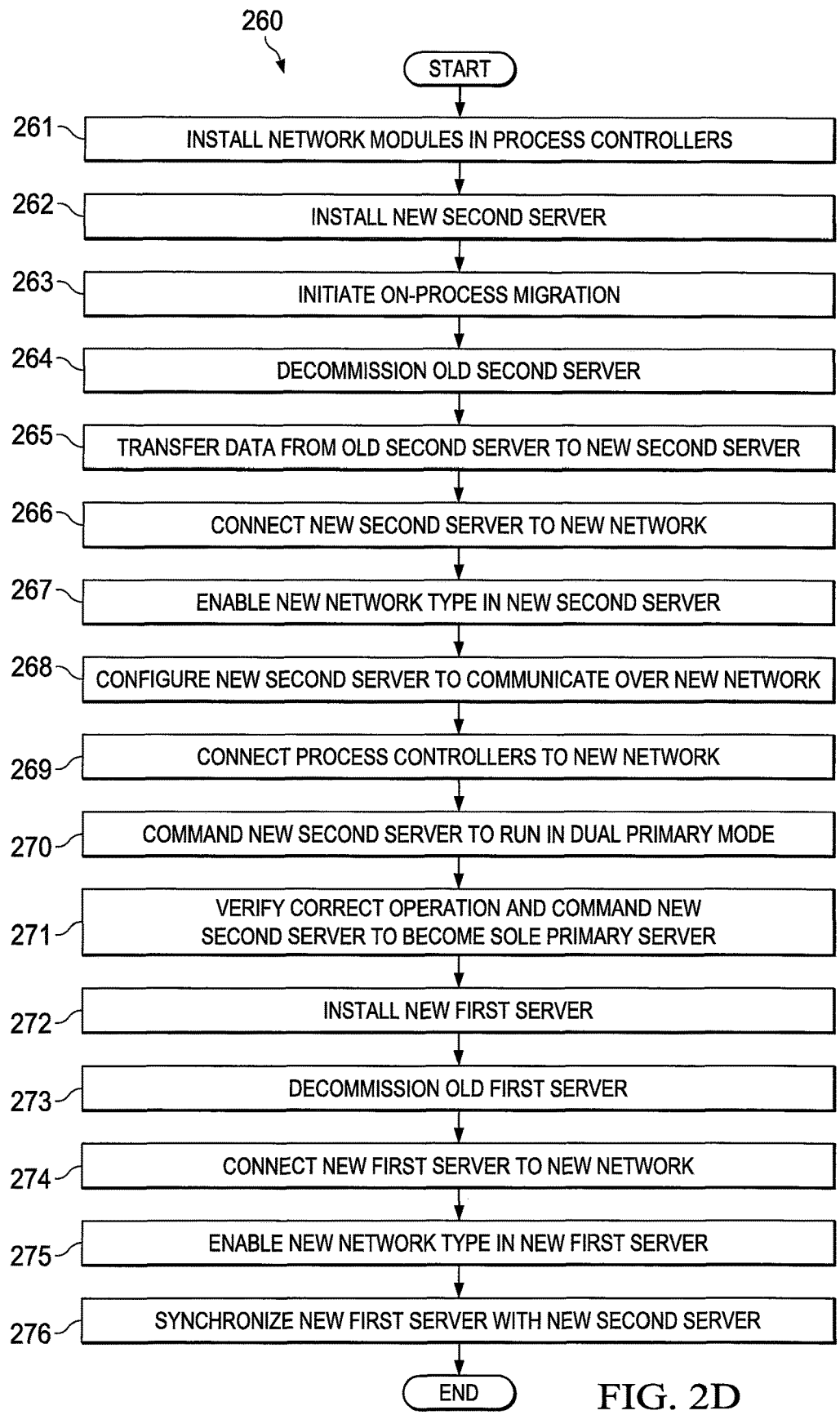

In other embodiments, the portion of the migration process shown in FIG. 2A can be accomplished using a method 260 as shown in FIG. 2D. Note that FIG. 2D assumes both (i) the servers 215a-215b are being upgraded to the servers 220a-220b while performing an on-process migration of server software and (ii) the supervisory network 230 is being replaced with the supervisory network 235.

As shown in FIG. 2D, new network-capable modules are inserted into the "Level 1" process controllers 205a-205b (while the controllers 205a-205b are running) at step 261. These modules are used to communicate over the supervisory network 235 that has been, is being, or will be installed. A new second server 220b is installed in the system at step 262. The new second server 220b can already include hardware that allows the new second server 220b to communicate over the new network 235. If not, new network infrastructure (such as a suitable network interface card, cabling, and switches) can be added to the server 220b. An on-process migration of server software is initiated at step 263. This can denote a standard function of the servers 215a-215b and can, among other things, stop the synchronization between the servers 215a-215b.

The old second server 215b is decommissioned at step 264. New software (if not already installed) can be installed on the new second server 220b and data from the old second server 215b is transferred to the new second server 220b at step 265. Note that some systems may allow the installation of the new software prior to initiating the on-process migration. The new second server 220b is connected to the new network 235 and powered on (if not already on) at step 266. The new network type for the new network 235 is enabled on the new second server 220b at step 267. The new second server 220b is configured to communicate with the "Level 1" process controllers 205a-205b over the new network 235 at step 268.

The "Level 1" process controllers 205a-205b are connected to the new network 235 at step 269, such as via the new modules in the process controllers 205a-205b. The new second server 220b is commanded to run in dual primary mode at step 270. This allows the new second server 220b and the new network 235 to be verified while the old first server 215a is used to control the underlying industrial process(es). Once verification of the new second server 220b and the new network 235 is complete, the new second server 220b is commanded to become the sole primary server at step 271. This allows the old first server 215a to be replaced and upgraded while the new second server 220b controls the underlying industrial process(es).

A new first server 220a is installed in the system at step 272. The new first server 220a can already include hardware that allows the new first server 220a to communicate over the new network 235. If not, new network infrastructure (such as a suitable network interface card, cabling, and switches) can be added to the server 220a. The old first server 215a is decommissioned at step 273. New software (if not already installed) can be installed on the new first server 220a, and the new first server 220a is connected to the new network 235 and powered on (if not already on) at step 274. The new network type for the new network 235 is enabled on the new first server 220a at step 275. The new first server 220a is synchronized with the new second server 220b at step 276. The synchronization data includes configuration data that allows the new first server 220a to communicate with the "Level 1" process controllers 205a-205b over the new network 235. At this point, both servers 220a-220b are able to communicate with the process controllers 205a-205b via the new network 235, and (if needed) the server 220a is ready to take over and act as the primary server.

Note that in FIG. 2D, it is assumed that the old servers 215a-215b are being migrated to a newer hardware platform that executes a newer software version than the software executed by the old servers 215a-215b. However, this need not be the case. For example, in some instances, the old servers 215a-215b could be migrated to the new servers 220a-220b only by upgrading the servers to a newer software version without upgrading the servers' hardware.

Figure 2E:
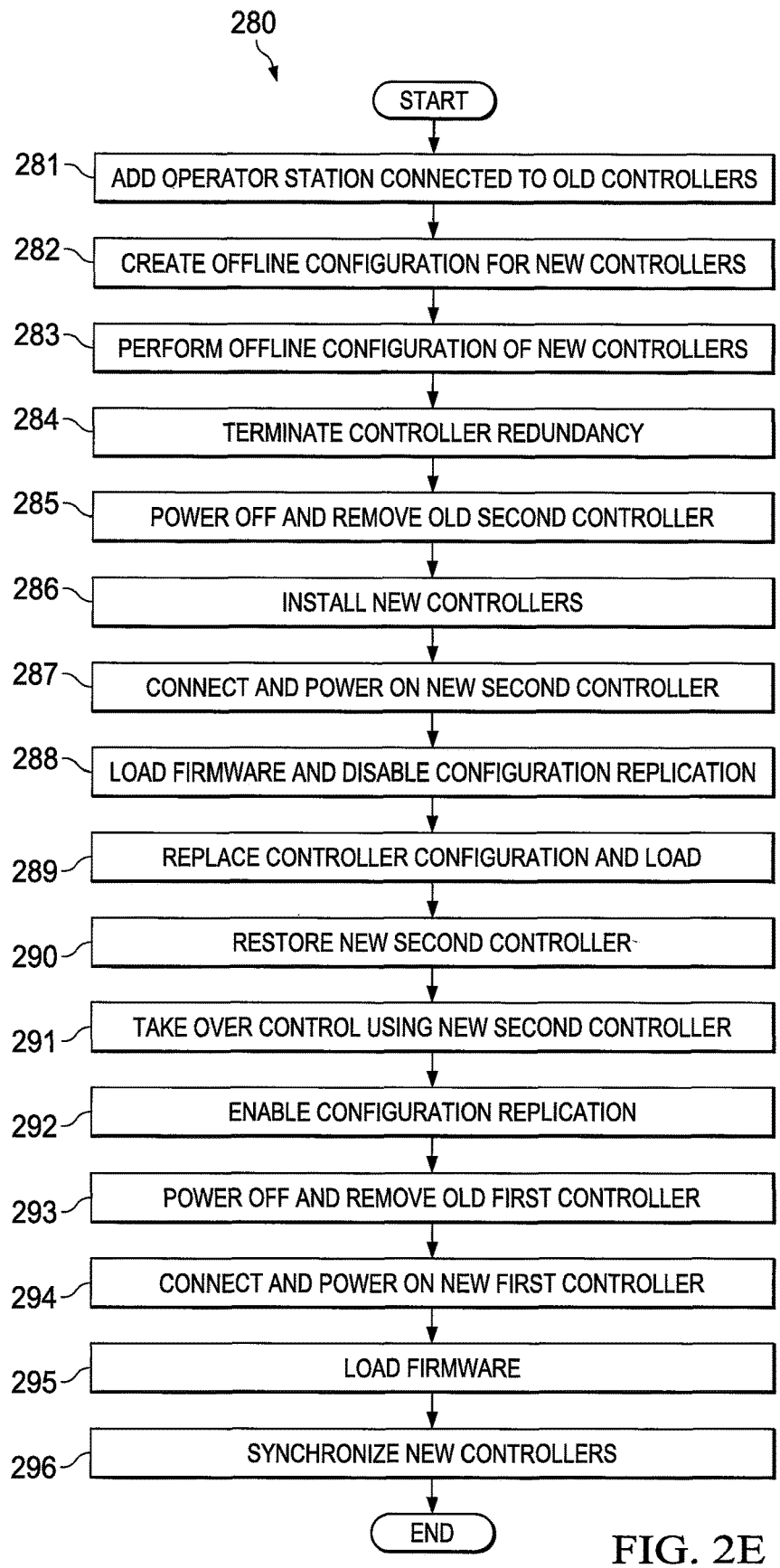

In some embodiments, the portion of the migration process shown in FIG. 2B can be accomplished using a method 280 as shown in FIG. 2E. Note that FIG. 2E assumes the servers 215a-215b have been upgraded to the servers 220a-220b. As noted above, however, upgrading of the servers 215a-215b is not required.

As shown in FIG. 2E, an operator station 225 that is directly connected to the redundant "Level 1" process controllers 205a-205b is added to the system at step 281. An additional offline "Level 1" process controller configuration is created for the new controllers 210a-210b at step 282. The additional offline process controller configuration is equivalent to the configuration for the original "Level 1" process controllers 205a-205b, but the additional configuration is designed for the new process controllers 210a-210b. Various software tools are available and known in the art for automatically generating controller configurations. As part of this additional controller configuration, names, addressing information, and I/O configurations from the original process controllers 205a-205b can be maintained. Also, path information of off-node connections initiated from the old controllers 205a-205b over the old network 230 are reconfigured so the new process controllers 210a-210b communicate over the new network 235.

Path information of connections initiated by other controllers to the old controllers 205a-205b is reconfigured offline so the other controllers can initiate connections to the new controllers 210a-210b over the new network 235 at step 283. This configuration reconfigures path information from the other controllers that initiate connections to the old controllers 205a-205b so that the connections can be restored when the new controllers 210a-210b take over. This is a different configuration from the additional offline "Level 1" process controller configuration created earlier in step 282. The configuration in step 282 is used to load the controller 210b before it takes control from the controller 205a, while the configuration in step 283 is used after the controller 210b takes control.

The redundancy between the old process controllers 205a-205b is terminated at step 284, so the industrial process(es) can be controlled from a non-redundant process controller 205a. This could denote a standard function in systems that use redundant controllers. The old second controller 205b is powered off, supervisory and I/O network cables are disconnected from the controller 205b, and the controller 205b and its associated components are removed at step 285. Unlike "Level 1" process controllers 210a-210b and associated components (such as supervisory network modules) are installed in place of the old second controller 205b or in another location at step 286. In some embodiments, this could be done using a kit in which two new controllers can be installed in place of one old controller chassis. The supervisory and I/O network cables that were previously connected to the old second controller 205b are connected to the new second controller 210b, and the new second controller 210b and other associated components are powered on at step 287. Firmware is loaded onto the new second controller 210b and replication of a process control configuration from the primary server 220a/220b to the direct-connected operator station 225 is disabled at step 288. At this point, operator controls and process views by the original controller 205b can be controlled using the direct-connected operator station 225.

The original "Level 1" process controller configuration is removed from storage, such as from Engineering Repository and Server nodes (but not from the direct-connected operator station 225), and replaced with the offline configuration prepared for the new controllers at step 289. This can be done in an automated manner. The offline configuration is also loaded to the new second controller 210b at step 289. Run-time or other data is retrieved from the old first controller 205a, translated if needed to be compatible with the new second controller 210b, and stored to the new second controller 210b at step 290. The new second controller 210b is commanded to take over control, such as by performing a redundancy role change to the primary role with cold or warm activation, at step 291. The following can be performed to allow the new second controller 210b to take control of an industrial process. The new controller 210b communicates with the original controller 205a to ensure control can be transferred to the new controller 210b. The new controller 210b takes mastership of I/O, and the new controller 210b delays control executions to ensure field-connected inputs have valid field values. The new controller 210b then resumes control execution as specified, including off-node connections initiated from the new controller 210b. During this time, the new controller 210b is operated from the primary server, and the direct-connected operator station 225 is used to operate the controller 205b until the controller 210b takes control.

Replication of the process control configuration from the primary server 220a or 220b to the direct-connected operator station 225 is enabled at step 292. The result of enabling the replication to the operator station 225 is that the configuration is synchronized from the servers 220a-220b to the operator station 225, which will allow operation and view of the controller 210b from the operator station 225. At that point, the off-node configuration (from step 283) can be automatically loaded to other controllers so off-node connections can be restored and associated execution resumed. The old first controller 205a is powered off, supervisory and I/O network cables from the controller 205a are disconnected, and the controller 205a is removed at step 293. The supervisory and I/O network cables that were previously connected to the old first controller 205a are connected to the new first controller 210a and the new first controller 210a and other associated components are powered on at step 294. Firmware is loaded onto the new first controller 210a at step 295, and synchronization is enabled between the new second controller 210b and the new first controller 210a at step 296. At this point, the new controller 210b is functioning as the primary controller, and the new controller 210a (when synchronized) is ready to take over and become primary if and when necessary.

The second step of the migration process shown in FIG. 2B can be repeated until all "Level 1" process controllers have been migrated. At the end of this migration, new "Level 1" process controllers have been installed and are operational, and the migration occurs while maintaining control and operator view over the industrial process(es) being controlled.

Note that the upgrade to a different physical supervisory network medium of the "Level 2" servers could be done along with or separate from the migration of the "Level 1" process controllers. Also note that during the migration of the "Level 1" process controllers and/or the migration of the "Level 2" servers, many of the steps described above could be performed in an automated manner. For example, a software tool or other tool could oversee the migration process, trigger various actions on the devices, obtain information identifying status or results, and interact with users as needed.

Although FIGS. 2A through 2E illustrate one example of a technique and related methods for migration of devices in an industrial process control and automation system, various changes may be made to FIGS. 2A through 2E. For example, specific procedures are described above for performing various steps of the migration process, which are examples only and depend in part on the specific types of devices being migrated. Moreover, various steps in FIGS. 2C through 2E could be combined, further subdivided, rearranged, or omitted and additional steps could be added according to particular needs.

The remainder of the description below relates to an example upgrade from a HONEYWELL EXPERIONPKS C200 controller to a HONEYWELL EXPERIONPKS C300 controller. This example upgrade is illustrative of the inventive approaches described in this patent document, but this patent document is not limited to this particular example upgrade.

Figure 3:
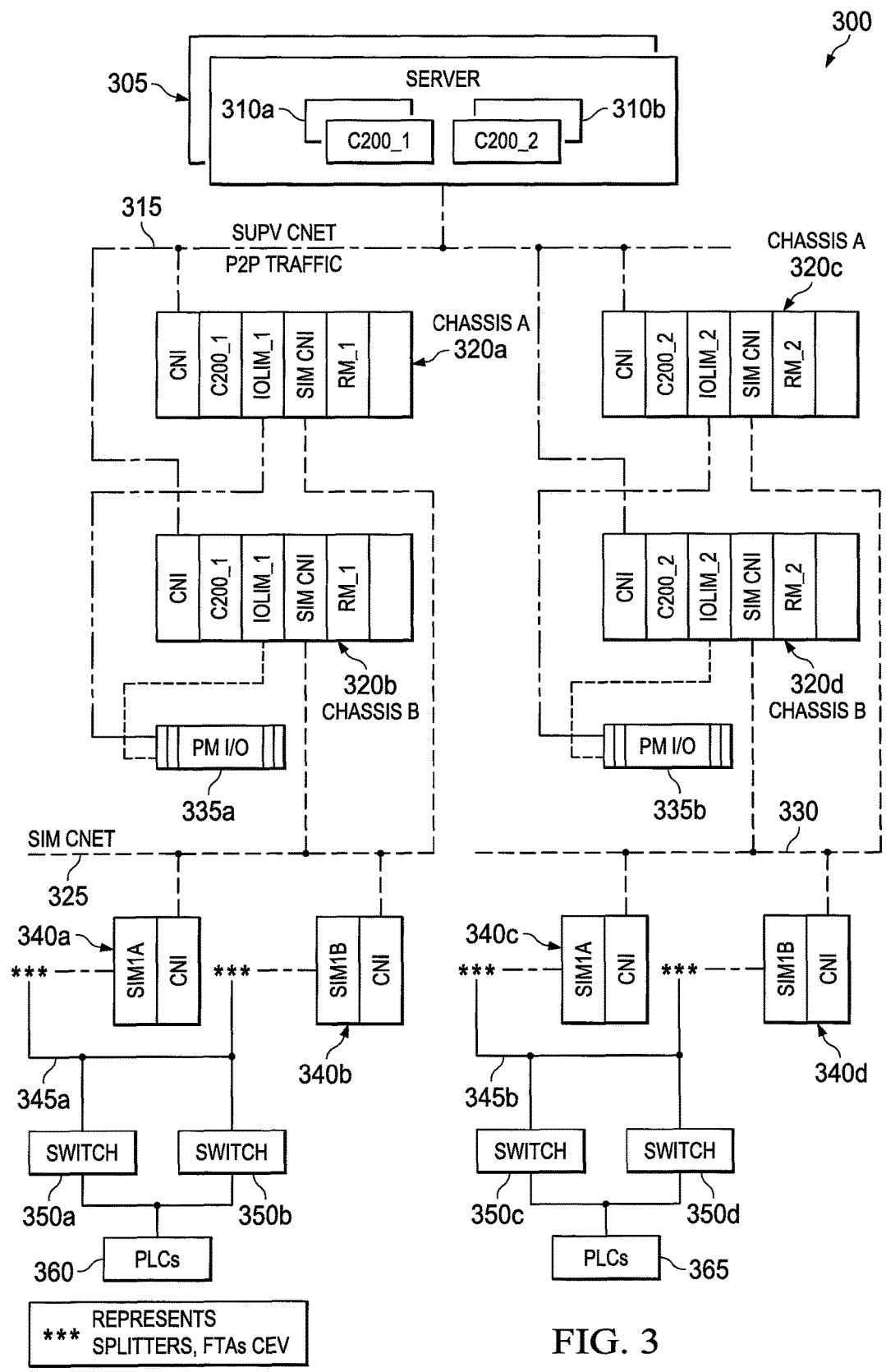
FIGS. 3 and 4 illustrate example industrial process control and automation systems that use different types of process controllers according to this disclosure.
Figure 4:
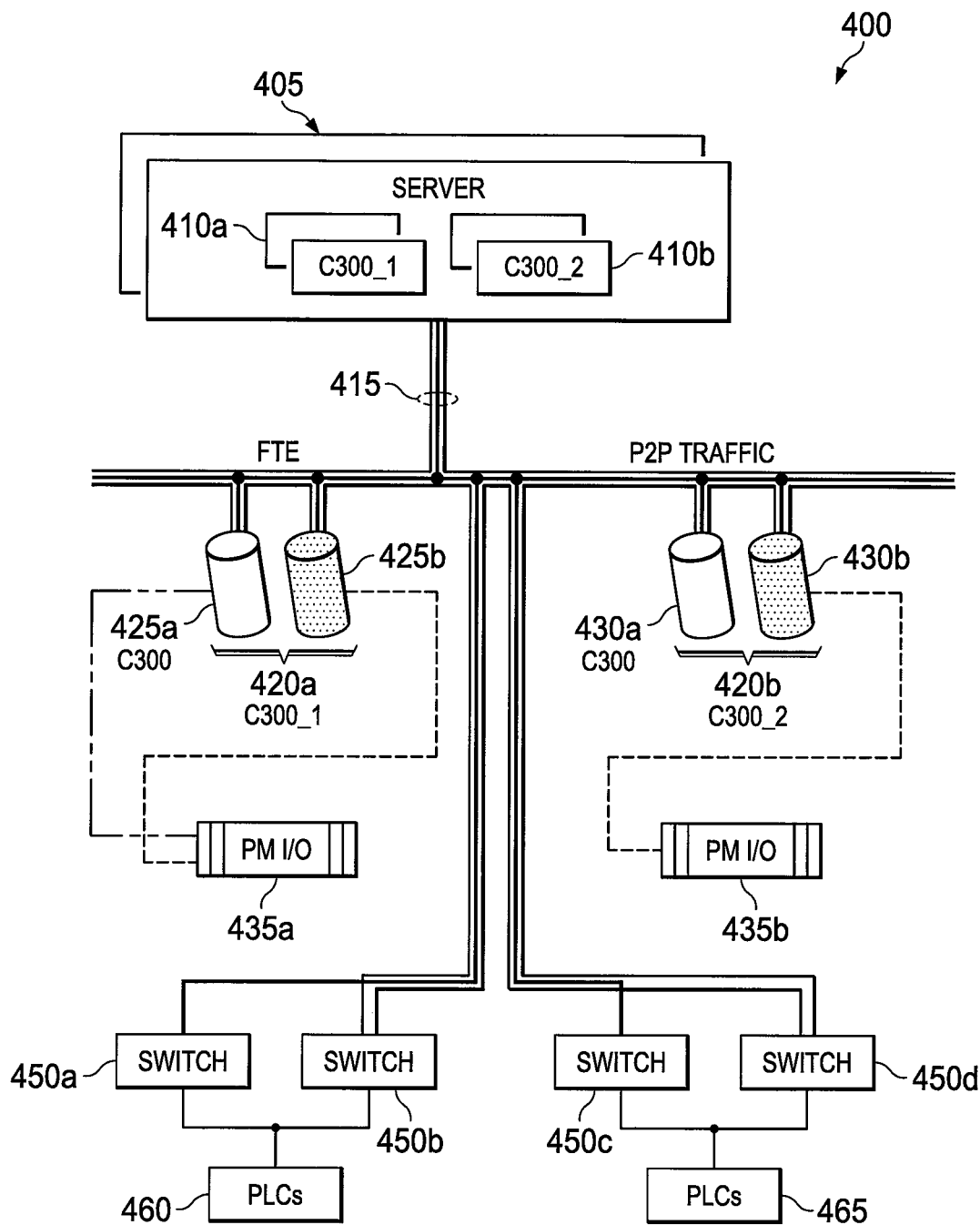

FIGS. 3 and 4 illustrate example industrial process control and automation systems that use different types of process controllers according to this disclosure. In particular, FIG. 3 illustrates an example system 300 that uses HONEYWELL EXPERIONPKS C200 controllers, while FIG. 4 illustrates an example system 400 that uses HONEYWELL EXPERIONPKS C300 controllers.

As shown in FIG. 3, the system 300 uses multiple servers 305 that support various C200 configurations 310a-310b. The servers 305 communicate over a supervisory network 315, such as a ControlNet network. Various chassis 320a-320d of equipment implement C200 controllers and can interact with the servers 305 via the supervisory network 315. The C200 controllers in the various chassis 320a-320d communicate through other control networks 325-330 and I/O devices 335a-335b.

Communications can occur over the control networks 325-330 with pairs of equipment 340a-340d, where each equipment pair includes a serial interface module (SIM) and a control network interface (CNI). The serial interface modules support communications with various switches 350a-350d, which communicate with several programmable logic controllers (PLCs) 360 and 365. The architecture in FIG. 3 is designed to provide redundant control and communication paths to and from the PLCs 360 and 365.

As shown in FIG. 4, the system 400 uses multiple servers 405 that support various C300 configurations 410a-410b. The servers 405 communicate over a network 415, such as an Ethernet or FTE network, with redundant pairs 420a-420b of devices. The pairs 420a-420b of devices include C300 controllers 425a-425b and C300 controllers 430a-430b. The devices can communicate with I/O devices 435a-435b and with PLCs 460 and 465 via switches 450a-450d. The architecture in FIG. 4 is also designed to provide redundant control and communication paths to and from the C300 controllers.

Figure 5:
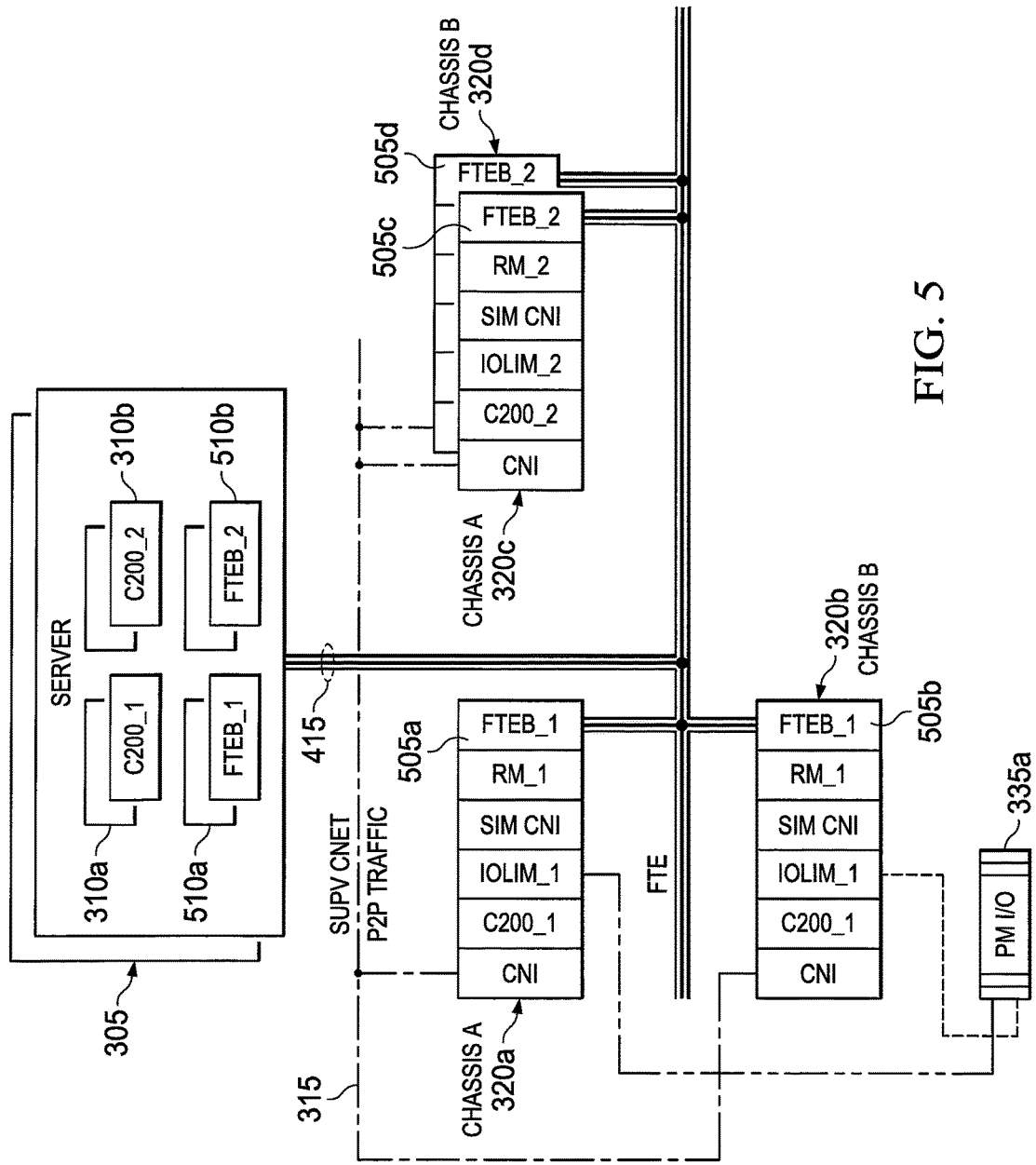
FIGS. 5 through 10 illustrate an example migration of process controllers from the system of FIG. 3 to the system of FIG. 4 according to this disclosure.

FIGS. 5 through 10 illustrate an example migration of process controllers from the system 300 of FIG. 3 to the system 400 of FIG. 4 according to this disclosure. As shown in FIG. 5, a supervisory network 415, which here denotes an FTE network, has been installed in the system 300. The C200 controllers have received FTE interfaces 505a-505d, which enable the C200 controllers to communicate via the FTE network 415. The servers 305 have also received FTE configurations 510a-510b and related interfaces, which enable the servers 305 to communicate via the FTE network 415.

Figure 6:
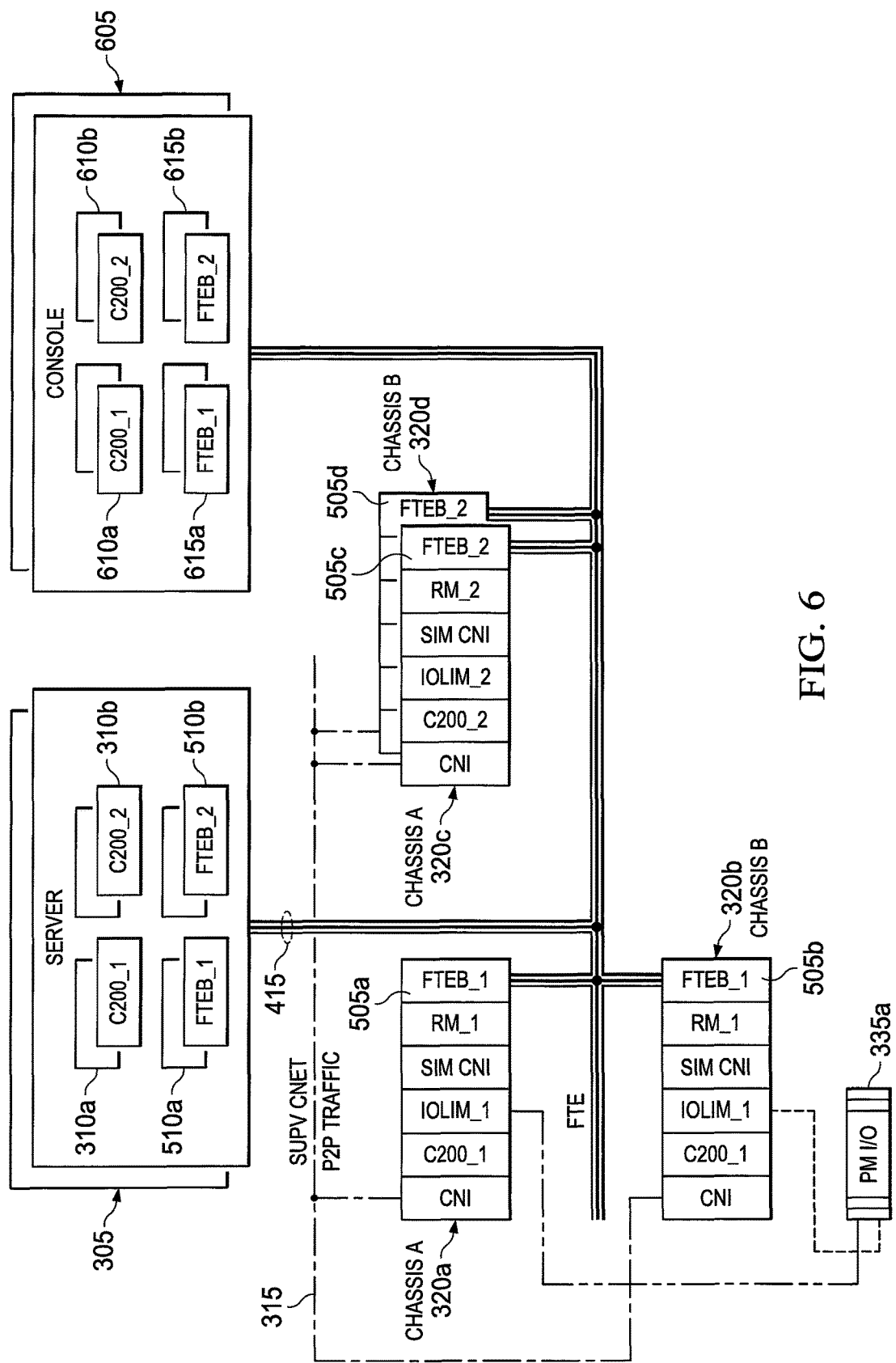

As shown in FIG. 6, at least one operator station 605 is connected to the upgraded supervisory network 415, such as when a HONEYWELL CONSOLE STATION serves as the operator station with direct connectivity to the controllers. The operator station 605 includes C200 configurations 610a-610b and FTE configurations 615a-615b and related interfaces, which enable the operator station 605 to communicate via the FTE network. The operator station 605 is used as described above to reduce or prevent loss of view or control during a migration.

Figure 7:
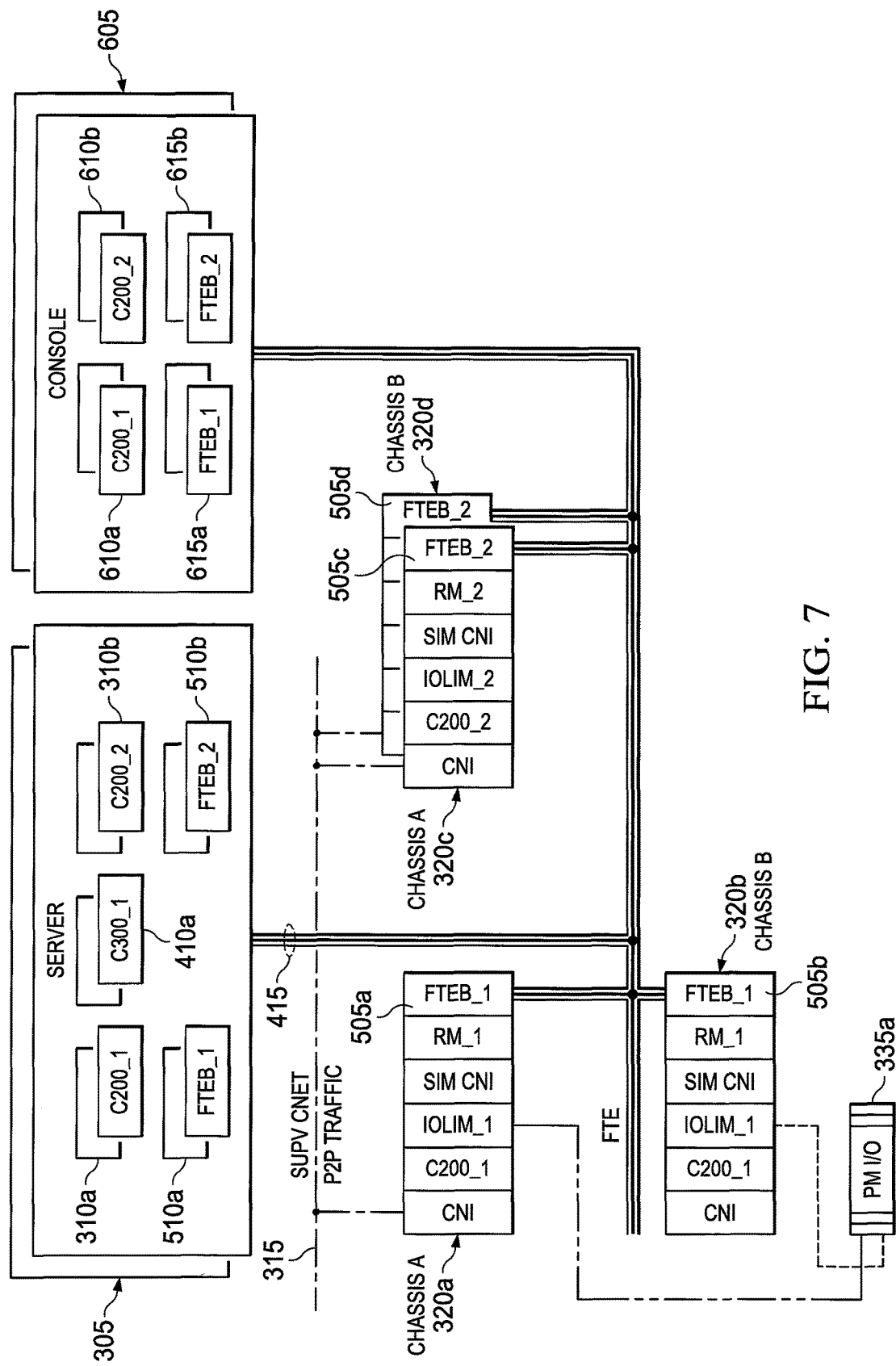
Figure 8:
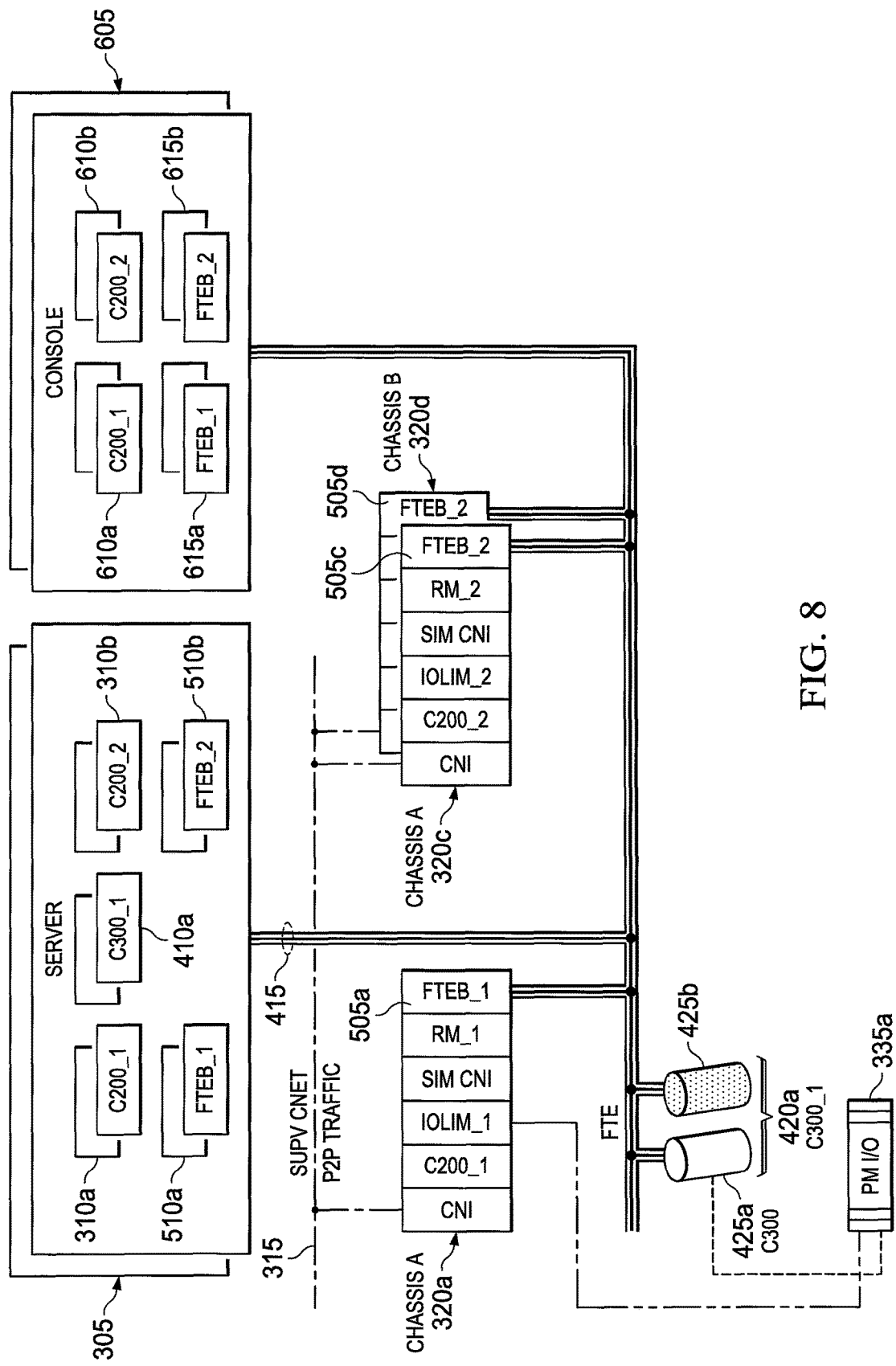

As shown in FIG. 7, a C300 configuration 410a is provided to the server 305. The C300 configuration 410a can be used to configure the server 305 for communication with and control of a C300 controller. As shown in FIG. 8, the C200 controller in the chassis 320b has been removed and replaced with a pair of devices 420a that include the C300 controllers 425a-425b.

Once the configuration in FIG. 8 has been created, one or more wizards or other applications could be executed to help set up devices in the system properly. For example, steps performed by a wizard running on a server 305 or operator station 605 can prompt a user for a restart option and prepare the C300 controller 425a. The wizard can also load firmware onto the C300 controller 425a and set the C300 controller 425a to function as a secondary controller. The wizard can further load a configuration into the C300 controller 425a, retrieve checkpoint data from the C200 controller in the chassis 320a, and restore run-time data to the C300 controller 425a. In addition, the wizard can prompt the user for an acknowledgement to continue. During this time, controller peer-to-peer (P2P) communication traffic continues over the control network 315, and the operator station 605 can be used to operate points resident on the C200 configuration 610a.

Once these operations are completed, the C300 controller 425a is transitioned into the primary role, while simultaneously the C200 controller in the chassis 320a is reset. This could be done by the wizard commanding the C300 controller 425a to activate as primary and the controller 425a commanding the C200 controller in the chassis 320a to reset. The C200 and FTE configurations 310a and 510a can be removed from the servers 305, and P2P traffic to and from the C300 controller 425a can be moved onto the network 415. During this time, outputs from various devices can be held.

Figure 9:
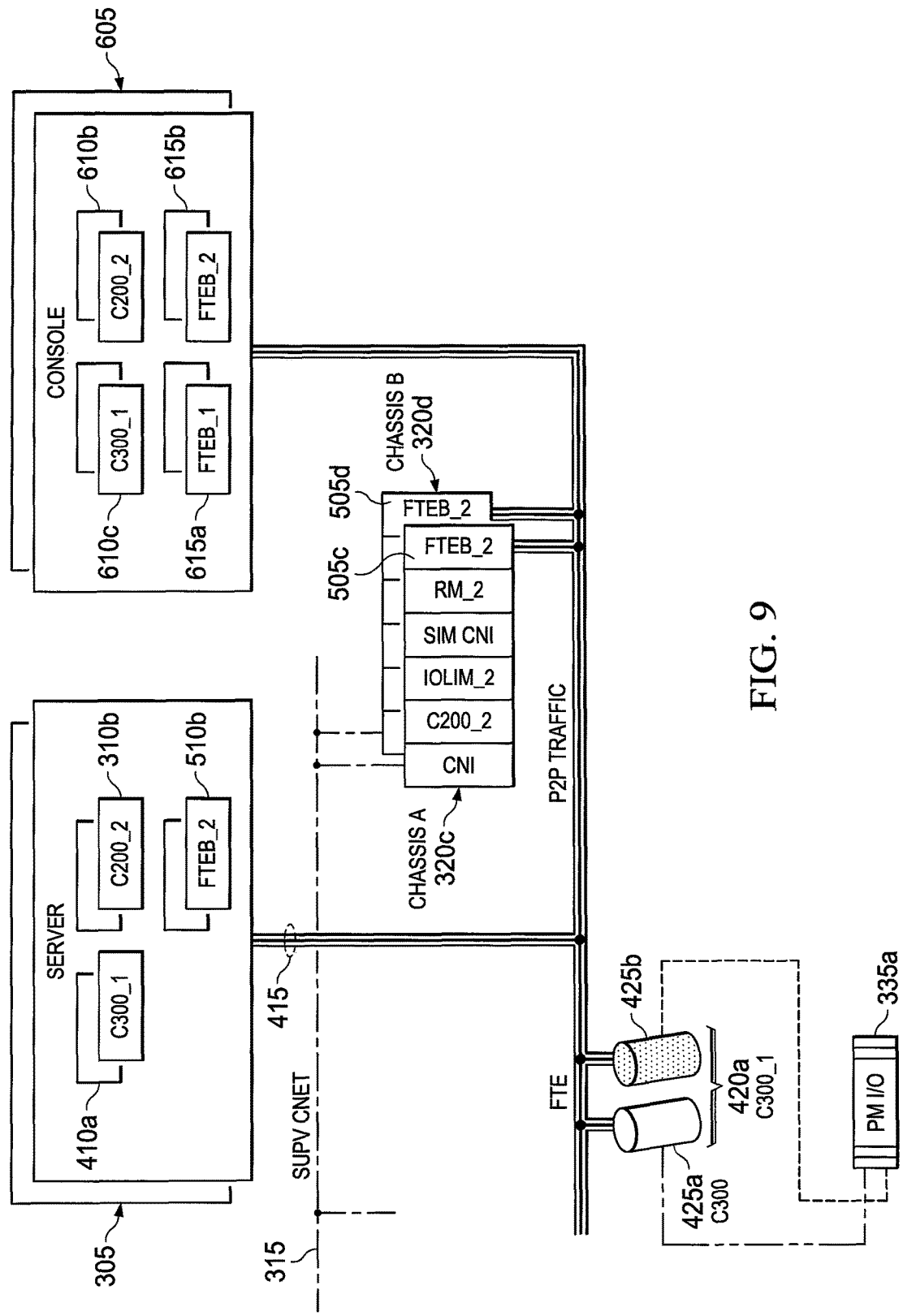
Figure 10:
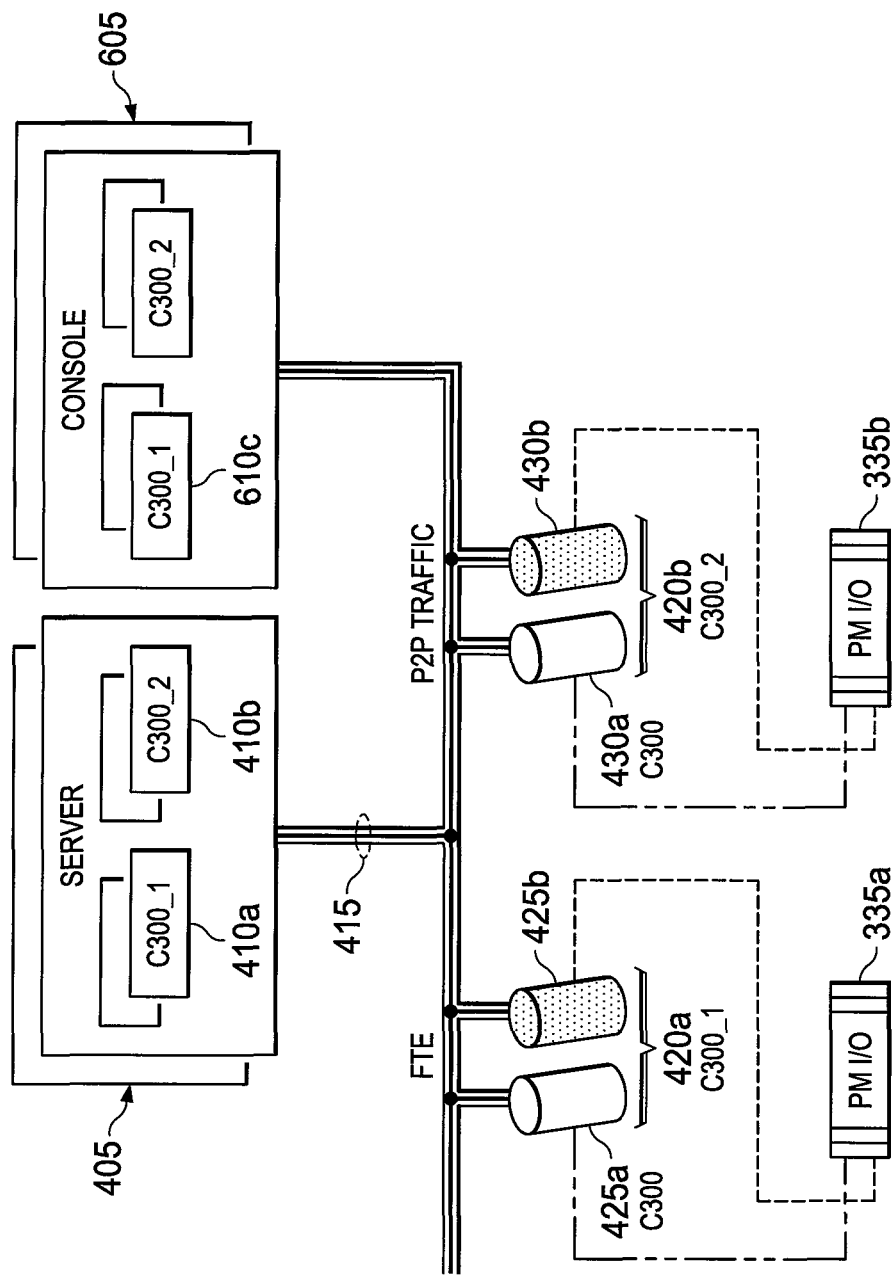

The wizard can then continue by instructing the user to perform specific actions and waiting for an acknowledgement that these actions have been completed. The actions include connecting I/O cables from the chassis 320a to the (currently unpowered) C300 controller 425b and then powering on the C300 controller 425b. At this point, the server 305 and the operator station 605 can be used to operate points resident on the C300 configuration 410a and 610c, and the chassis 320a can be removed. The resulting structure of the system is shown in FIG. 9. Repeating the same or similar process can result in removal of the C200 controllers in the chassis 320c-320d and the insertion of the pair 420b of C300 controllers 430a-430b as shown in FIG. 10. In FIG.

10, the servers are denoted as servers 405 since the C200 functionality has been replaced with the C300 functionality.

Although FIGS. 3 and 4 illustrate examples of industrial process control and automation systems that use different types of process controllers and FIGS. 5 through 10 illustrate one example of a migration of process controllers from the system of FIG. 3 to the system of FIG. 4, various changes may be made to FIGS. 3 through 10. For example, the systems shown in FIGS. 3 through 10 represent specific systems that use specific types of process controllers. These specific types of process controllers could be used in any other suitable manner, and migrations can involve any other suitable process controllers.

Figure 11:
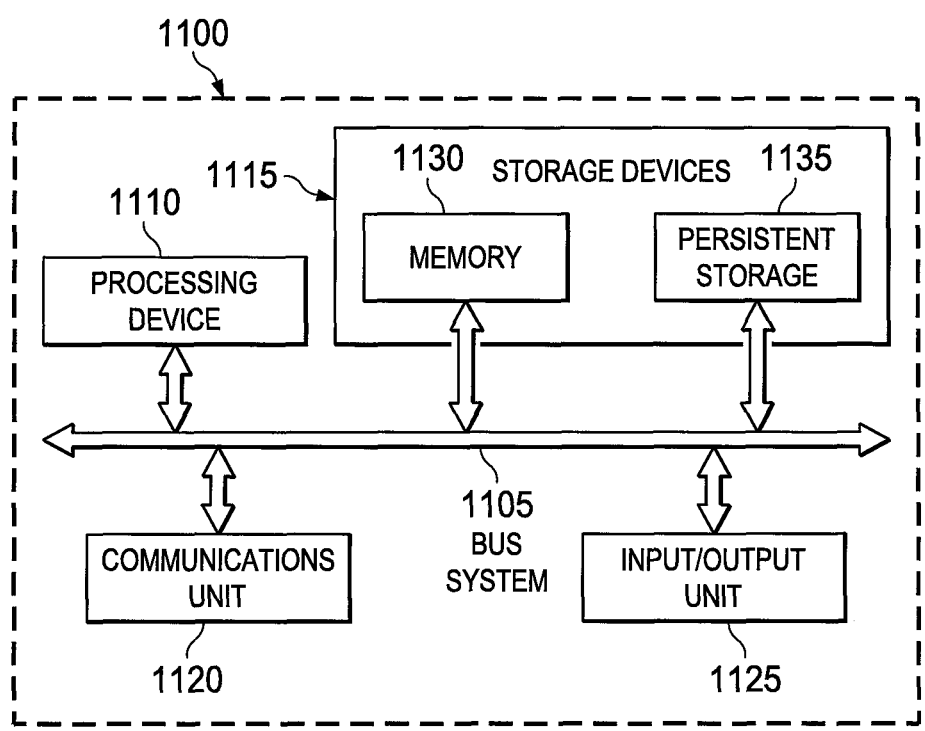
FIG. 11 illustrates an example computing device supporting migration of devices in an industrial process control and automation system according to this disclosure.

FIG. 11 illustrates an example computing device 1100 supporting migration of devices in an industrial process control and automation system according to this disclosure. The device 1100 could, for example, denote any of the controllers or operator stations described above.

As shown in FIG. 11, the device 1100 includes a bus system 1105, which supports communication between at least one processing device 1110, at least one storage device 1115, at least one communications unit 1120, and at least one input/output (I/O) unit 1125. The processing device 1110 executes instructions that may be loaded into a memory 1130. The processing device 1110 may include any suitable number(s) and type(s) of processors or other devices in any suitable arrangement. Example types of processing devices 1110 include microprocessors, microcontrollers, digital signal processors, field programmable gate arrays, application specific integrated circuits, and discrete circuitry.

The memory 1130 and a persistent storage 1135 are examples of storage devices 1115, which represent any structure(s) capable of storing and facilitating retrieval of information (such as data, program code, and/or other suitable information on a temporary or permanent basis). The memory 1130 may represent a random access memory or any other suitable volatile or non-volatile storage device(s). The persistent storage 1135 may contain one or more components or devices supporting longer-term storage of data, such as a read only memory, hard drive, Flash memory, or optical disc.

The communications unit 1120 supports communications with other systems or devices. For example, the communications unit 1120 could include a network interface card or a wireless transceiver facilitating communications over the network 105. The communications unit 1120 may support communications through any suitable physical or wireless communication link(s). When the device 100 denotes a Level 1 controller or a Level 2 server or operator station, the communications unit 1120 could denote the interface(s) used to communicate over the networks 230-235.

The I/O unit 1125 allows for input and output of data. For example, the I/O unit 1125 may provide a connection for user input through a keyboard, mouse, keypad, touchscreen, or other suitable input device. The I/O unit 1125 may also send output to a display, printer, or other suitable output device.

Although FIG. 11 illustrates one example of a computing device 1100 supporting migration of devices in an industrial process control and automation system, various changes may be made to FIG. 11. For example, computing devices come in a wide variety of configurations. The device 1100 shown in FIG. 11 is meant to illustrate one example type of computing device and does not limit this disclosure to a particular type of computing device.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. A method comprising:

installing second communication interfaces in chassis of first process controllers of an industrial process control and automation system without removing first communication interfaces already installed in the chassis of the first process controllers, the first process controllers configured to communicate over a first supervisory network using the first communication interfaces, the second communication interfaces configured to communicate over a second supervisory network of a different type; and migrating the first process controllers to second process controllers of a different type while maintaining control over an industrial process being controlled by the first process controllers, the second process controllers configured to communicate over the second supervisory network.

2. The method of claim 1, wherein migrating the first process controllers to the second process controllers comprises:

using an operator station coupled to the second supervisory network to control operator controls and process views involving at least one of the first process controllers and the second process controllers during the migration.

3. The method of claim 1, wherein migrating the first process controllers to the second process controllers comprises:

terminating a redundancy of the first process controllers;
disconnecting a secondary one of the first process controllers;
connecting a primary one of the second process controllers to network connections of the secondary one of the first process controllers;
loading a configuration into the primary one of the second process controllers; and
restoring the primary one of the second process controllers using data from a primary one of the first process controllers.

4. The method of claim 3, wherein migrating the first process controllers to the second process controllers further comprises:

controlling the industrial process using the primary one of the second process controllers.

5. The method of claim 4, wherein migrating the first process controllers to the second process controllers further comprises:

disconnecting the primary one of the first process controllers;
connecting a secondary one of the second process controllers to network connections of the primary one of the first process controllers; and
synchronizing the secondary one of the second process controllers to the primary one of the second process controllers.

6. The method of claim 1, wherein the second process controllers differ from the first process controllers in at least one of: software basis, physical form-factor, cabinet layout, power subsystem, physical supervisory network medium, and processor or memory hardware.

7. The method of claim 1, further comprising:

migrating the industrial process control and automation system from the first supervisory network to the second supervisory network.

8. The method of claim 7, wherein migrating from the first supervisory network to the second supervisory network comprises:

migrating from the first supervisory network to the second supervisory network without migrating supervisory servers coupled to the first and second supervisory networks.

9. The method of claim 7, wherein migrating from the first supervisory network to the second supervisory network comprises:

migrating from the first supervisory network to the second supervisory network while migrating first supervisory servers to second supervisory servers, the first supervisory servers configured to communicate over the first supervisory network, the second supervisory servers configured to communicate over the second supervisory network.

10. The method of claim 1, further comprising:

migrating first supervisory servers to second supervisory servers while maintaining control over the industrial process, the first supervisory servers configured to communicate over the first supervisory network, the second supervisory servers configured to communicate over the second supervisory network.

11. A method comprising:

installing second communication interfaces in chassis of process controllers of an industrial process control and automation system without removing first communication interfaces already installed in the chassis of the process controllers, the process controllers configured to communicate over a first supervisory network using the first communication interfaces, the second communication interfaces configured to communicate over a second supervisory network of a different type; and migrating first supervisory servers to second supervisory servers while maintaining control over an industrial process being controlled by the process controllers, the first supervisory servers configured to communicate over the first supervisory network, the second supervisory servers configured to communicate over the second supervisory network.

12. The method of claim 11, wherein migrating the first supervisory servers to the second supervisory servers comprises:

using an operator station coupled to the second supervisory network to control operator controls and process views involving the process controllers during the migration.

13. The method of claim 11, wherein migrating the first supervisory servers to the second supervisory servers comprises:

terminating a redundancy of the first supervisory servers;
disconnecting a secondary one of the first supervisory servers;
connecting a primary one of the second supervisory servers to the second supervisory network; and
synchronizing the primary one of the second supervisory servers using data from a primary one of the first supervisory servers.

14. The method of claim 13, wherein migrating the first supervisory servers to the second supervisory servers further comprises:

performing a failover from the primary one of the first supervisory servers to the primary one of the second supervisory servers.

15. The method of claim 14, wherein migrating the first supervisory servers to the second supervisory servers further comprises:
- disconnecting the primary one of the first supervisory servers;
- connecting a secondary one of the second supervisory servers to the second supervisory network; and
- synchronizing the secondary one of the second supervisory servers to the primary one of the second supervisory servers.

16. The method of claim 11, wherein migrating the first supervisory servers to the second supervisory servers comprises:
- terminating a redundancy of the first supervisory servers;
- disconnecting a secondary one of the first supervisory servers;
- adding network infrastructure to the secondary one of the first supervisory servers to create a primary one of the second supervisory servers;
- connecting the primary one of the second supervisory servers to the second supervisory network; and
- synchronizing the primary one of the second supervisory servers using data from a primary one of the first supervisory servers.

17. The method of claim 16, wherein migrating the first supervisory servers to the second supervisory servers further comprises:
- disconnecting the primary one of the first supervisory servers;
- adding network infrastructure to the primary one of the first supervisory servers to create a secondary one of the second supervisory servers;
- connecting the secondary one of the second supervisory servers to the second supervisory network; and
- synchronizing the secondary one of the second supervisory servers to the primary one of the second supervisory servers.

18. The method of claim 11, wherein the second supervisory servers differ from the first supervisory servers in at least one of: software basis, physical form-factor, cabinet layout, power subsystem, physical supervisory network medium, and processor or memory hardware.

19. The method of claim 11, further comprising:
- migrating the industrial process control and automation system from the first supervisory network to the second supervisory network.

20. The method of claim 11, further comprising:
- migrating first process controllers to second process controllers of a different type while maintaining control over the industrial process.

21. A method comprising:
- controlling an industrial process using first process controllers of an industrial process control and automation system, each of the first process controllers comprising a first communication interface for communicating over a first supervisory network and a second communication interface for communicating over a second supervisory network of a different type;
- installing a direct-connected operator station configured to communicate directly with the first process controllers;
- replacing a secondary one of the first process controllers with a primary one of multiple second process controllers;
- operating the primary one of the second process controllers using at least a primary server while operating a primary one of the first process controllers using the direct-connected operator station; and
- replacing the primary one of the first process controllers with a secondary one of the second process controllers;
- wherein the first process controllers are replaced with the second process controllers while maintaining control over the industrial process.

* * * * *